United States Patent
Kong et al.

(10) Patent No.: US 12,015,111 B2
(45) Date of Patent: Jun. 18, 2024

(54) LIGHT EMITTING DEVICE PACKAGE AND LIGHT SOURCE MODULE

(71) Applicant: SUZHOU LEKIN SEMICONDUCTOR CO., LTD., Taicang (CN)

(72) Inventors: Sung Min Kong, Seoul (KR); Sung Ho Kim, Seoul (KR); Taek Kyun Kim, Seoul (KR)

(73) Assignee: SUZHOU LEKIN SEMICONDUCTOR CO., LTD., Taicang (CN)

(*) Notice: Subject to any disclaimer, the term of this patent is extended or adjusted under 35 U.S.C. 154(b) by 733 days.

(21) Appl. No.: 17/261,935

(22) PCT Filed: Jun. 10, 2019

(86) PCT No.: PCT/KR2019/006954
§ 371 (c)(1),
(2) Date: Jan. 21, 2021

(87) PCT Pub. No.: WO2020/032373
PCT Pub. Date: Feb. 13, 2020

(65) Prior Publication Data
US 2021/0305475 A1    Sep. 30, 2021

(30) Foreign Application Priority Data
Aug. 10, 2018    (KR) .................. 10-2018-0093579

(51) Int. Cl.
*H01L 33/62* (2010.01)
*H01L 33/38* (2010.01)
(Continued)

(52) U.S. Cl.
CPC ............ *H01L 33/62* (2013.01); *H01L 33/382* (2013.01); *H01L 33/46* (2013.01); *H01L 33/486* (2013.01);
(Continued)

(58) Field of Classification Search
CPC ....... H01L 33/62; H01L 33/382; H01L 33/46; H01L 33/486; H01L 33/50; H01L 33/60;
(Continued)

(56) References Cited

U.S. PATENT DOCUMENTS

2005/0029112 A1* 2/2005 Dietterle ................. C25D 3/60
205/252
2013/0193464 A1* 8/2013 Bae ....................... H01L 33/405
257/94

FOREIGN PATENT DOCUMENTS

KR      10-0625600      9/2006
KR    10-2013-0007096    1/2013
(Continued)

OTHER PUBLICATIONS

KR20180041489 (Year: 2018).*
(Continued)

*Primary Examiner* — Patricia D Valenzuela
(74) *Attorney, Agent, or Firm* — Birch, Stewart, Kolasch & Birch, LLP

(57) ABSTRACT

A light emitting device package according to an embodiment comprises: first and second frames disposed spaced apart from each other; a body disposed surrounding the first and second frames and having first and second openings spaced apart from each other; a light emitting device disposed on the body and including first and second bonding parts; and first and second conductive parts disposed in the first and second openings respectively, wherein the first and second openings perpendicularly overlap the first and second frames (Continued)

respectively, the first and second conductive parts are electrically connected to the first and second frames respectively, the first and second bonding parts are disposed in the first and second openings respectively, and are electrically connected to the first and second conductive parts, and the light emitting device includes a support region disposed on the body outside the first and second openings. In addition, a light source module, according to an embodiment, comprises a circuit board and at least one light emitting device package disposed on the circuit board.

19 Claims, 6 Drawing Sheets

(51) Int. Cl.
*H01L 33/46* (2010.01)
*H01L 33/48* (2010.01)
*H01L 33/50* (2010.01)
*H01L 33/60* (2010.01)
*H01L 33/40* (2010.01)
*H01L 33/64* (2010.01)

(52) U.S. Cl.
CPC .............. *H01L 33/50* (2013.01); *H01L 33/60* (2013.01); *H01L 33/405* (2013.01); *H01L 33/641* (2013.01)

(58) Field of Classification Search
CPC ..... H01L 33/20; H01L 33/38; H01L 25/0753; H01L 33/40; H01L 33/483; H01L 33/52; H01L 33/641; H01L 33/405
See application file for complete search history.

(56) References Cited

FOREIGN PATENT DOCUMENTS

| KR | 10-2014-0036545 | 3/2014 |
| KR | 10-2014-0061797 | 5/2014 |
| KR | 10-2014-0092038 | 7/2014 |
| KR | 10-2018-0041489 | 4/2018 |

OTHER PUBLICATIONS

International Search Report dated Sep. 26, 2019 issued in Application No. PCT/KR2019/006954.
Liang, Renli et al. Experimental Study on the Effects of Eutectic Voids on the Thermal Performance Within Flip-Chip Ultraviolet Light-Emitting Diodes. IEEE Transactions on Components, Packaging and Manufacturing Technology; vol. 6, No. 10, Sep. 29, 2016, pp. 1488-1492.

* cited by examiner

LIGHT EMITTING DEVICE PACKAGE AND LIGHT SOURCE MODULE

CROSS-REFERENCE TO RELATED PATENT APPLICATIONS

This application is a U.S. National Stage Application under 35 U.S.C. § 371 of PCT Application No. PCT/KR2019/006954, filed Jun. 10, 2019, which claims priority to Korean Patent Application No. 10-2018-0093579, filed Aug. 10, 2018, whose entire disclosures are hereby incorporated by reference.

TECHNICAL FIELD

An embodiment relates to a light emitting device package and a light source module including the same.

BACKGROUND ART

A semiconductor device including compounds such as GaN and AlGaN has a lot of advantages such as having wide and easily adjustable band gap energy and may be used variously as a light emitting device, a light-receiving device, and various diodes.

In particular, a light emitting device such as a light emitting diode or a laser diode using a compound semiconductor material of Group III-V or Group II-VI of a semiconductor has an advantage that may realize light of various wavelength bands such as red, green, blue, and ultraviolet rays by development of thin film growth technology and device materials. In particular, a light emitting device such as a light emitting diode or a laser diode using a compound semiconductor material of Group III-V or Group II-VI of a semiconductor may realize a white light source with high efficiency by using fluorescent materials or combining colors. Such a light emitting device has advantages of low power consumption, semi-permanent lifetime, fast response speed, safety, and environmental friendliness as compared with conventional light sources such as fluorescent lamps and incandescent lamps.

In addition, when a light-receiving device such as a photodetector or a solar cell is manufactured using a compound semiconductor material of Group III-V or Group II-VI, by developing device materials, light of various wavelength regions from gamma rays to a radio wavelength region may be utilized by absorbing light of various wavelength regions and generating a photocurrent. In addition, such a light-receiving device has advantages of fast response speed, safety, environmental friendliness and easy control of device materials, so that it may be easily used for power control or a microwave circuit or communication module.

Accordingly, a semiconductor device has been expanded to a transmitting module of an optical communication means, a light emitting diode backlight which replaces a cold cathode fluorescent lamp (CCFL) constituting a backlight of a liquid crystal display (LCD) device, white light emitting diode lighting device which may replace the fluorescent lamp or the incandescent lamp, automotive headlights, traffic lights, and even sensors sensing gas or fire. In addition, the semiconductor device may be extended to high-frequency application circuits or other power control devices, and even communication modules.

A light emitting device (LED) may be provided, for example, as a p-n junction diode having a characteristic in which electric energy is converted into light energy by using Group III-V or Group II-V elements on the periodic table, and may realize various wavelengths by adjusting a composition ratio of a compound semiconductor.

For example, a nitride semiconductor has received a great interest in a development field of an optical device and a high-power electronic device due to high thermal stability and wide band gap energy thereof. In particular, an ultraviolet (UV) LED, a blue LED, a green LED, a yellow LED, a red LED, and the like using the nitride semiconductor are commercialized and used widely.

For example, an ultraviolet light emitting device is a light emitting diode that emits light distributed in a wavelength band of 200 nm to 400 nm, in the wavelength band, a short wavelength may be used for sterilization, purification, or the like, and a long wavelength may be used for an exposure apparatus, a curing apparatus, or the like.

Ultraviolet rays may be classified into three categories of UV-A 315 nm to 400 nm), UV-B 280 nm to 315 nm), and UV-C 200 nm to 280 nm) in a descending order of wavelength. The UV-A 315 nm to 400 nm) region is applied to various fields such as industrial UV curing, printing ink curing, an exposure apparatus, counterfeit discrimination, photocatalytic sterilization, a special lighting system (aquarium/agriculture, etc.), and the like. The UV-B 280 nm to 315 nm) region is used for medical applications, and the UV-C 200 nm to 280 nm) region is applied to air purification, water purification, sterilization products, and the like.

Meanwhile, as a semiconductor device capable of providing high output is required, research on a semiconductor device capable of increasing output by applying high power is being conducted.

In addition, in a light emitting device package, research is being conducted on a method capable of improving the reliability of the package.

In addition, in a light emitting device package, research is being conducted on a method capable of improving light extraction efficiency of a light emitting device and improving brightness at a package stage.

In addition, in the semiconductor device package, research is being conducted on a method capable of improving a bonding force between the semiconductor device and the package. In detail, as a size of the semiconductor device becomes smaller, research is being conducted on a method capable of improving a coupling force between the semiconductor device and a lead frame.

In addition, research is being conducted on a method capable of improving the reliability of the package by effectively discharging heat emitted from the semiconductor device.

In addition, research is being conducted on a method capable of preventing cracks from occurring between the semiconductor device and the lead frame due to thermal shock by preventing formation of a void between the semiconductor device and the lead frame.

In addition, in the semiconductor device package, research is being conducted on a method for reducing a manufacturing cost and improving a manufacturing yield by improving a process yield and changing a structure thereof.

DISCLOSURE

Technical Problem

An object of an embodiment is to provide a light emitting device package and a light source module capable of preventing a void from being formed between a frame and a conductive portion by disposing the conductive portion on a bonding portion.

In addition, another object of an embodiment is to provide a light emitting device package and a light source module capable of preventing cracks from occurring between the bonding portion of the light emitting device and the conductive portion, and between the conductive portion and the frame due to heat emitted from the light emitting device.

In addition, still another object of an embodiment is to provide a light emitting device package and a light source module with a slimmer structure because a thickness of a body may be reduced.

In addition, yet another object of an embodiment is to provide a light emitting device package and a light source module capable of guiding light emitted from the light emitting device in an upward direction to improve light efficiency and luminous flux.

In addition, yet another object of an embodiment is to provide a light emitting device package and a light source module capable of efficiently discharging heat emitted from the light emitting device.

In addition, yet another object of an embodiment is to provide a light emitting device package and a light source module capable of preventing a phenomenon that a bonding region between a light emitting device and a body is re-melted while the light emitting device package is bonded to a substrate or the like.

Technical Solution

A light emitting device package according to an embodiment includes a first and second frames disposed to be spaced apart from each other, a body disposed surrounding the first and second frames and having first and second openings spaced apart from each other, a light emitting device disposed on the body and including first and second bonding portions, and first and second conductive portions disposed in the first and second openings, respectively, wherein the first and second openings vertically overlap the first and second frames, respectively, the first and second conductive portions are electrically connected to the first and second frames, respectively, the first and second bonding portions are disposed in the first and second openings, respectively, and are electrically connected to the first and second conductive portions, and the light emitting device includes a support region disposed on the body outside the first and second openings.

In addition, a light source module according to an embodiment includes a circuit board and at least one light emitting device package disposed on a circuit board.

Advantageous Effects

In the embodiment, it is possible to prevent formation of a void between a bonding portion and a conductive portion, and thus it is possible to prevent cracks from occurring between the bonding portion and the conductive portion due to thermal shock or the like.

In addition, in the embodiment, it is possible to improve a coupling force between the conductive portion and a frame, and thus it is possible to prevent cracks from occurring between the conductive portion and the frame due to thermal shock or the like.

In addition, in the embodiment, it is possible to prevent a phenomenon that a bonding region between a light emitting device and a body is re-melted while a light emitting device package is bonded to a substrate or the like by forming the conductive portion on the bonding portion of the light emitting device.

In addition, in the embodiment, it is possible to reduce a thickness of the body, and thus it is possible to have a slimmer structure, and to improve light efficiency and luminous flux by effectively guiding light emitted from the light emitting device to an upper portion.

In addition, in the embodiment, it is possible to effectively discharge heat emitted from the light emitting device by the conductive portion disposed on the bonding portion, and thus heat dissipation characteristics of the light emitting device package may be improved.

In addition, in the embodiment, it is possible to prevent a defect between the light emitting device and the frame by forming the conductive portion in advance on the bonding portion of the light emitting device. In detail, when a size of the light emitting device is small, soldering between the light emitting device and the frame is very difficult, and thus defects such as alignment failure, crack generation, and void formation may occur. However, in the embodiment, it is possible to prevent the above-mentioned defects from occurring by forming the conductive portion on the bonding portion in advance. Accordingly, the reliability and process efficiency of the light emitting device package may be improved.

MODES OF THE INVENTION

Figure 1:
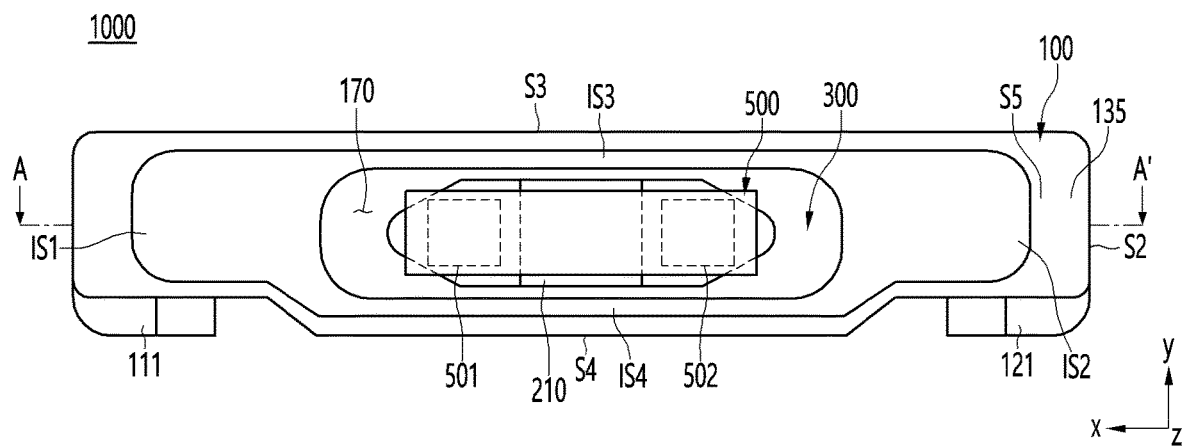
FIG. 1 is a front view of a light emitting device package according to an embodiment.

Hereinafter, embodiments of the present invention will be described in detail with reference to the accompanying drawings.

However, the spirit and scope of the present invention is not limited to a part of the embodiments described, and may be implemented in various other forms, and within the spirit and scope of the present invention, one or more of the elements of the embodiments may be selectively combined and replaced.

In addition, unless expressly otherwise defined and described, the terms used in the embodiments of the present invention (including technical and scientific terms may be construed the same meaning as commonly understood by one of ordinary skill in the art to which this invention belongs, and the terms such as those defined in commonly used dictionaries may be interpreted as having a meaning that is consistent with their meaning in the context of the relevant art.

In addition, the terms used in the embodiments of the present invention are for describing the embodiments and are not intended to limit the present invention. In this specification, the singular forms may also include the plural forms unless specifically stated in the phrase, and may include at least one of all combinations that may be combined in A, B, and C when described in "at least one (or more) of A (and), B, and C".

In addition, in describing the elements of the embodiments of the present invention, the terms such as first, second, A, B, (A, and (b) may be used. These terms are only used to distinguish the elements from other elements, and the terms are not limited to the essence, order, or order of the elements. Further, when an element is described as being "connected", "coupled", or "connected" to another element, it may include not only when the element is directly "connected" to, "coupled" to, or "connected" to other elements, but also when the element is "connected", "coupled", or "connected" by another element between the element and other elements.

In addition, when described as being formed or disposed "on (over)" or "under (below)" of each element, the "on (over)" or "under (below)" may include not only when two elements are directly connected to each other, but also when one or more other elements are formed or disposed between two elements.

A semiconductor device package according to an embodiment of the present invention will be described in detail with reference to the accompanying drawings. The semiconductor device package of the present invention may include a semiconductor device or a light emitting device that emits ultraviolet light, infrared rays, or visible light. Hereinafter, it will be described based on a case in which a light emitting device is applied as an example of a semiconductor device, and a package or a light source device to which the light emitting device is applied may include a non-light emitting device, for example, an element such as a Zener diode, or a sensing element monitoring a wavelength or heat. Hereinafter, it will be described based on a case in which the light emitting device is applied will be described as an example of the semiconductor device, and the light emitting device package will be described in detail.

In addition, prior to describing the light emitting device package according to the embodiment of the present invention, a first direction may be an x-axis direction shown in the drawings, and a second direction may be a y-axis direction shown in the drawings, and may be a direction orthogonal to the x-axis direction. Further, a third direction may be a z-axis direction shown in the drawings, and may be a direction orthogonal to the x-axis and the y-axis.

Figure 2:
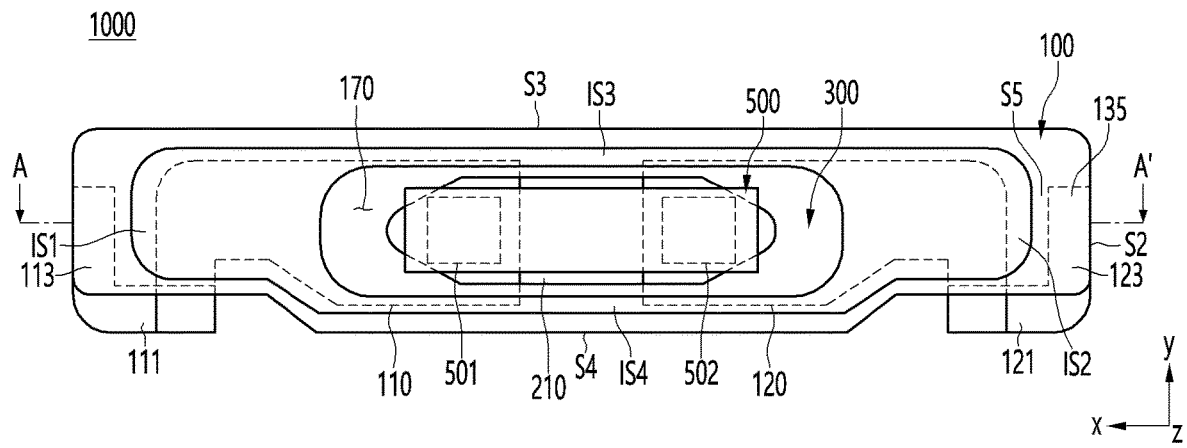
FIG. 2 is a view showing a frame of a package body of a light emitting device package according to an embodiment.
Figure 3:
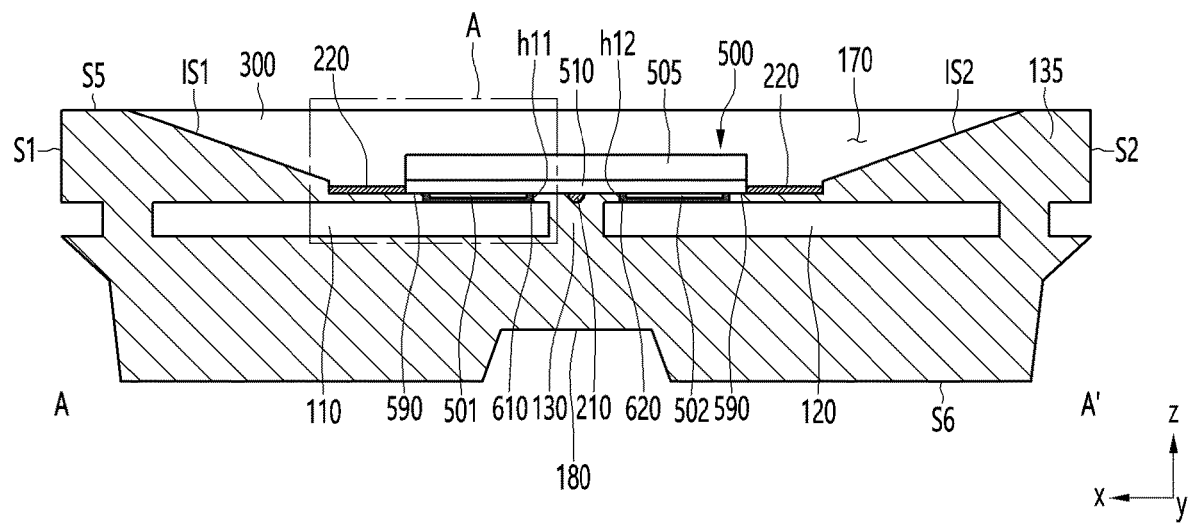
FIG. 3 is a cross-sectional view taken along line A-A' of FIG. 1.
Figure 4:
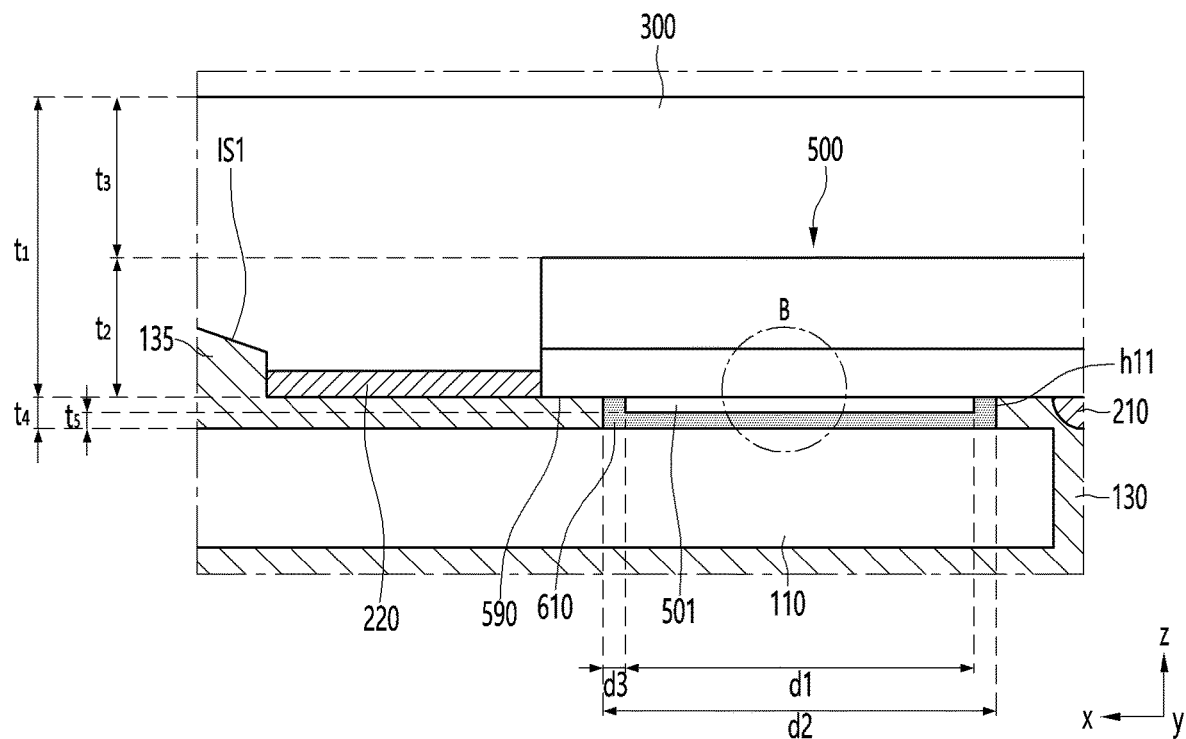
FIG. 4 is an enlarged view of region A of FIG. 3.

FIG. 1 is a front view of a light emitting device package according to an embodiment, and FIG. 2 is a view showing a frame of a package body of a light emitting device package according to an embodiment. In addition, FIG. 3 is a cross-sectional view taken along line A-A' of FIG. 1, and FIG. 4 is an enlarged view of region A in FIG. 3.

Referring to FIGS. 1 to 4, a light emitting device package 1000 according to an embodiment may include a package body 100 and a light emitting device 500.

The package body 100 may include a plurality of frames. For example, the package body 100 may include a first frame 110 and a second frame 120 spaced apart from each other. The first frame 110 may be disposed to be spaced apart from the second frame 120 in a first direction (x-axis direction).

The package body 100 may include a body 130. The body 130 may be disposed to surround the first frame 110 and the second frame 120. The body 130 may be disposed between the first frame 110 and the second frame 120. An upper surface of the body 130 may be positioned above upper surfaces of the first and second frames 110 and 120. The body 130 may function as an electrode separation line between the plurality of frames. The body 130 may be referred to as an insulating member.

The body 130 may be disposed on the first frame 110. In addition, the body 130 may be disposed on the second frame 120. The body 130 may provide inclined inner surfaces IS1, IS2, IS3, and IS4 on the first and second frames 110 and 120. A cavity 170 may be provided on the first frame 110 and the second frame 120 by the inclined inner surfaces IS1, IS2, IS3, and IS4. A height (third direction) of the cavity 170 may be about 300 μm or less. In detail, a height t1 of the cavity 170 may be about 130 μm to about 280 μm. In more detail, the height t1 of the cavity 170 may be about 130 μm to about 260 μm. The package body 100 according to the embodiment may be provided in a structure with the cavity 170, or may be provided in a structure in which an upper surface of the package body 100 is flat without the cavity 170. An upper body 135 may be disposed on the body 130, and the upper body 135 may have the cavity 170. The upper body 135 may be disposed with the same material as the body 130 or a different material. In addition, the upper body 135 may be formed integrally with the body 130.

The body 130 may include a plurality of openings. The body 130 may include the plurality of openings spaced apart from each other. For example, the body 130 may include a first opening h11 and a second opening h12. The first and second openings h11 and h12 may be disposed on a bottom surface of the cavity 170. The first and second openings h11 and h12 may be disposed on the upper surface of the body 130. The first and second openings h11 and h12 may be disposed to be spaced apart from each other.

The first opening h11 may be disposed on the first frame 110. The first opening h11 may overlap the first frame 110 in a vertical direction. A lower surface of the first opening h11 may be disposed on the same plane as the upper surface of the first frame 110. The first opening h11 may expose the upper surface of the first frame 110. An area of an upper region of the first opening h11 may be different from or equal to an area of a lower region thereof. For example, the area of the upper region of the first opening h11 may be smaller than the area of the lower region thereof. Here, the upper region of the first opening h11 may be a region positioned at an uppermost portion of the first opening h11. In addition, a virtual horizontal plane connecting the uppermost region of the first opening h11 may be disposed on the same plane as the upper surface of the body 130.

A height of the first opening h11 in the vertical direction may be about 30 μm or less. In detail, the height of the first opening h11 may be about 5 μm to about 30 μm.

The second opening h12 may be disposed on the second frame 120. The second opening h12 may overlap the second frame 120 in the vertical direction. A lower surface of the second opening h12 may be disposed on the same plane as the upper surface of the second frame 120. The lower surface of the second opening h12 may be disposed on the same plane as the lower surface of the first opening h11. The second opening h12 may expose the upper surface of the second frame 120. An area of an upper region of the second opening h12 may be different from or equal to an area of a lower region thereof. For example, the area of the upper region of the second opening h12 may be smaller than the area of the lower region thereof. Here, the upper region of the second opening h12 may be a region positioned at an uppermost portion of the second opening h12. In addition, a virtual horizontal plane connecting the uppermost region of the second opening h12 may be disposed on the same plane as the upper surface of the body 130. In addition, the area of each of the upper and lower regions of the second opening h12 may correspond to an area of each of the upper and lower regions of the first opening h11.

A height of the second opening h12 in the vertical direction may be about 30 μm or less. In detail, the height of the second opening h12 may be about 5 μm to about 30 μm. The height of the second opening h12 may correspond to the height of the first opening h11.

The body 100 may be made of a resin material or an insulating resin material. The body 100 may be formed of at least one selected from the group consisting of polyphthalamide (PPA), polychloro triphenyl (PCT), liquid crystal polymer (LCP), polyamide9T (PA9T), silicone, epoxy, epoxy molding compound (EMC), silicone molding compound (SMC), ceramic, photo sensitive glass (PSG), sapphire ($Al_2O_3$), and the like. The body 100 may be made of a resin material and may contain a filler of a high refraction material such as $TiO_2$ and $SiO_2$.

The upper body 135 may be made of the resin material or the insulating resin material. The upper body 135 may be formed of at least one selected from the group consisting of polyphthalamide (PPA), polychloro triphenyl (PCT), liquid crystal polymer (LCP), polyamide9T (PA9T), silicone, epoxy, epoxy molding compound (EMC), silicone molding compound (SMC), ceramic, photo sensitive glass (PSG), sapphire ($Al_2O_3$), and the like. The upper body 135 performs a function as a reflector.

The package body 100 may include a plurality of side surfaces. For example, the body 100 may include a first side surface S1 and a second side surface S2 facing each other in the first direction, and may include a third side surface S3 and a fourth side surface S4 facing each other in the second direction. The third side surface S3 and the fourth side surface S4 may be a side surface that connects the first side surface S1 and the second side surface S2. For example, the third side surface S3 may be extended in the first direction from one end of the first side surface S1 to be connected to one end of the second side surface S2. Further, the fourth side surface S4 may be extended in the first direction from the other end of the first side surface S1 to be connected to the other end of the second side surface S2. The first to fourth side surfaces S1, S2, S3, and S4 may be a surface perpendicular or inclined with respect to a lower surface of the body 100.

The package body 100 may have a length in the first direction (x-axis direction) and a length in a second direction (y-axis direction). The length in the first direction of the package body 100 may be different from the length in the second direction. For example, the length in the first direction of the package body 100 may be longer than the length in the second direction. In detail, the length of the package body 100 in the first direction may be about twice or longer than the length in the second direction. Here, the first direction may be a direction of a side having a longer length among lengths of the first and second directions of the light emitting device 500.

For example, the third side surface S3 and the fourth side surface S4 may be spaced apart in the second direction. A distance between the third side surface S3 and the fourth side surface S4 may correspond to a thickness of the package body 100. The thickness of the package body 100 may be about 1.2 mm or less. In detail, the thickness of the package body 100 may be about 1 mm or less.

In addition, the first side surface S1 and the second side surface S2 may be spaced apart in the first direction. A distance between the first side surface S1 and the second side surface S2 may be about twice or more the thickness of the package body 100. In detail, the distance between the first side surface S1 and the second side surface S2 may be about three times or more the thickness of the package body 100. In more detail, the distance between the first side surface S1 and the second side surface S2 may be about four times or more the thickness of the package body 100. That is, the length of the package body 100 in the first direction may be about 2.5 mm or more. In detail, the length of the package body 100 in the first direction may be about 2.7 mm to about 5 mm. In the light emitting device packages 1000, when the light emitting device packages 1000 are disposed in the first direction, a number of the light emitting device packages 1000 may be reduced by providing a longer length in the first direction. Since the light emitting device package 1000 may provide a relatively thin thickness T1, a thickness of the light unit including the light emitting device package 1000 may be reduced. Since a front surface S5 of the cavity 170 is opened and light is emitted, the light may be emitted in a side view type based on the fourth side surface S4.

The upper body 135 may include a plurality of inner surfaces. In detail, the upper body 135 may include inner surfaces IS1, IS2, IS3, and IS4 inclined around the cavity 170. The inner surfaces IS1, IS2, IS3, and IS4 may be inclined or vertical. The inner surfaces IS1, IS2, IS3, and IS4 may include a first inner surface IS1 and a second inner surface IS2 facing in the first direction, and a third inner surface IS3 and a fourth inner surface IS4 facing in the second direction. The third and fourth inner surfaces IS3 and IS4 may be inner surfaces connecting the first and second inner surfaces IS1 and IS2. The first inner surface IS1 may be adjacent to the first side surface S1, and the second inner surface IS2 may be adjacent to the second side surface S2. Further, the third inner surface IS3 may be adjacent to the third side surface S3, and the fourth inner surface IS4 may be adjacent to the fourth side surface S4. Inclination angles of the first and second inner surfaces IS1 and IS2 may be different from inclination angles of the third and fourth inner surfaces IS3 and IS4. For example, the inclination angles of the first and second inner surfaces IS1 and IS2 may be smaller than the inclination angles of the third and fourth inner surfaces IS3 and IS4. Accordingly, light emitted from the light emitting device 500 may be reflected through the smooth first and second inner surfaces IS1 and IS2, thereby improving reflection efficiency.

The package body 100 may include the front surface S5 and a rear surface S6. The front surface S5 of the package body 100 may be a surface on which the light emitted from the light emitting device 500 is emitted, and may be a surface on which the cavity 170 is disposed. The cavity 170 may be recessed from the front surface S5 toward the rear surface S6. The rear surface S6 of the package body 100 is a surface opposite to the front surface S5, and a concave portion 180 may be disposed thereon. The concave portion 180 may be disposed in a region corresponding to the light emitting device 500. The concave portion 180 may be disposed in a region overlapping the light emitting device 500 in a vertical direction (z-axis direction). The fourth side surface S4 may be a bottom portion of the package body 100 or the body 130 as shown in FIG. 1. The fourth side surface S4 may be a surface facing a circuit board 810 to be described later. The third side surface S3 may be an upper surface portion of the package body 100 or the body 130. In addition, the first side surface S1 and the second side surface S2 may be a side surface portion of the package body 100 or the body 130.

The light emitting device 500 may be disposed on the package body 100. The light emitting device 500 may be disposed in the cavity 170. The light emitting device 500 may be disposed at a position overlapping the first frame 110 and the second frame 120 in the vertical direction. The light emitting device 500 may be disposed on the first opening h11 and the second opening h12. The light emitting device 500 may be disposed at a position overlapping the first and second openings h11 and h12 in the vertical direction. The light emitting device 500 may be disposed on the body 130. The light emitting device 500 may be disposed at a position overlapping the body 130 in the vertical direction (z-axis direction). The light emitting device 500 may include a support region 590 around a lower surface thereof. The support region 590 of the light emitting device 500 may be disposed on the body 130. The support region 590 may be spaced apart from the first and second openings h11 and h12. The support region 590 may be positioned outside the first and second openings h11 and h12. The support region 590 may not overlap the first and second openings h11 and h12 in the vertical direction. The support region 590 of the light emitting device 500 may be in direct contact with the upper surface of the body 130.

The light emitting device 500 may include a light emitting structure 510, a first bonding portion 501 and a second bonding portion 502. The first bonding portion 501 and the second bonding portion 502 may be disposed on a bottom surface of the light emitting structure 510. The first and second bonding portions 501 and 502 may be disposed to be spaced apart from each other. The first bonding portion 501 may face the first frame 110. The first bonding portion 501 may overlap the first frame 110 in the vertical direction. The first bonding portion 501 may overlap the first opening h11 in the vertical direction. The first bonding portion 501 may be disposed in the first opening h11. In addition, a lower surface of the first bonding portion 501 may be positioned below the upper surface of the body 130, and may be positioned above the lower surface of the first opening h11. The second bonding portion 502 may face the second frame 120. The second bonding portion 502 may overlap the second frame 120 in the vertical direction. The second bonding portion 502 may overlap the second opening h12 in the vertical direction. The second bonding portion 502 may be disposed in the second opening h12. A lower surface of the second bonding portion 502 may be positioned below the upper surface of the body 130. In addition, the lower surface of the second bonding portion 502 may be positioned below the upper surface of the body 130, and may be positioned above the lower surface of the second opening h12.

The light emitting structure 510 may include a compound semiconductor. For example, the light emitting structure 510 may be provided as, for example, a Group II-VI or Group III-V compound semiconductor.

The light emitting structure 510 may include a first conductive type semiconductor layer 511, an active layer 512, and a second conductive type semiconductor layer 513. The first conductive type semiconductor layer 511 and the second conductive type semiconductor layer 513 may be implemented as at least one of the Group II-VI or Group III-V compound semiconductors. Further, the active layer 512 may be implemented as a compound semiconductor. The active layer 512 may be implemented as, for example, at least one of the Group III-V or Group II-VI compound semiconductors.

The light emitting device 500 may include one or a plurality of light emitting cells therein. The light emitting cell may include at least one of an n-p junction, a p-n junction, an n-p-n junction, and a p-n-p junction. The plurality of light emitting cells may be connected in series with each other in one light emitting device. Accordingly, the light emitting device 500 may have one or the plurality of light emitting cells, and when n light emitting cells are disposed in one light emitting device, it may be driven by n times a driving voltage. For example, when the drive voltage of one light emitting cell is 3V and two light emitting cells are disposed in one light emitting device, each light emitting device may be driven by a driving voltage of 6V. Alternatively, when the drive voltage of one light emitting cell is 3V and three light emitting cells are disposed in one light emitting device, each light emitting device may be driven by a driving voltage of 9V. The number of light emitting cells disposed in the light emitting device 500 may be one or two to five. The light emitting device 500 will be described in more detail with reference to FIGS. 8 and 9 which will be described later.

A thickness t2 of the light emitting device 500 may be smaller than the height t1 of the cavity 170. The thickness t2 of the light emitting device 500 disposed in the cavity 170 may be smaller than the height t1 of the cavity 170. The thickness t2 of the light emitting device 500 may be about 35% to about 65% of the height t1 of the cavity 170. In detail, the thickness t2 of the light emitting device 500 may be about 40% to about 60% of the height t1 of the cavity 170. As an example, the thickness t2 of the light emitting device 500 disposed in the cavity 170 may be about 110 μm to about 130 μm, and the height t1 of the cavity 170 may be about 220 μm to about 260 μm.

In addition, thickness of the first bonding portion 501 and the second bonding portion 502 of the light emitting device 500 may be about 10 μm or less. In detail, the thickness of the first bonding portion 501 and the second bonding portion 502 of the light emitting device 500 may be about 8 μm or less. In more detail, the thickness of the first bonding portion 501 and the second bonding portion 502 of the light emitting device 500 may be about 5 μm or less.

The package body 100 may include the first frame 110 and the second frame 120. The first frame 110 and the second frame 120 may be spaced apart from each other. The first frame 110 and the second frame 120 may have different polarities. For example, the first frame 110 may be connected to a P-type electrode of the light emitting device 500, and the second frame 120 may be connected to an N-type electrode of the light emitting device 500. In detail, the first frame 110 may be connected to the first bonding portion 501 of the light emitting device 500, and the second frame 120 may be connected to the second bonding portion 502 of the light emitting device 500.

The first frame 110 may extend toward the first side surface S1. In addition, the first frame 110 may include a first lead portion 111 that is bent toward the fourth side surface S4 and protrudes from the fourth side surface S4. The first lead portion 111 may protrude toward the fourth side surface S4. In addition, the first frame 110 may further include a first heat radiating portion 113 that is bent from the first lead portion 111 and disposed on a rear surface of the first side surface S1. The second frame 120 may extend toward the second side surface S2. In addition, the second frame 120 may include a second lead portion 121 that is bent toward the fourth side surface S4 and protrudes from the fourth side surface S4. The second lead portion 121 may protrude toward the fourth side surface S4. In addition, the second frame 120 may further include a second heat radiating portion 123 that is bent from the second lead portion 121 and disposed on a rear surface of the second side surface S2.

The first frame 110 and the second frame 120 may be provided as a conductive frame. The first frame 110 and the second frame 120 may be provided as a metal frame. The first frame 110 and the second frame 120 may be electrically connected to the light emitting device 500. The first frame 110 and the second frame 120 may contain at least one of copper (Cu), titanium (Ti), nickel (Ni), gold (Au), chromium (Cr), tantalum (Ta), platinum (Pt), tin (Sn), and silver (Ag). The first frame 110 and the second frame 120 may be formed in a single layer or multiple layers.

A thickness of each of the first frame 110 and the second frame 120 may be about 120 µm or more. In detail, the thickness of each of the first frame 110 and the second frame 120 may be about 120 µm to about 250 µm. The first frame 110 and the second frame 120 may improve the structural strength of the package body 100, and it is desirable that the thickness satisfies the above-described range in consideration of heat dissipation characteristics and electrical characteristics.

Conductive portions 610 and 620 may be disposed between the light emitting device 500 and the frames 110 and 120. For example, a first conductive portion 610 and a second conductive portion 620 spaced apart from each other may be disposed between the light emitting device 500 and the frames 110 and 120.

The first conductive portion 610 may be disposed between the first bonding portion 501 of the light emitting device 500 and the first frame 110. The first conductive portion 610 may be disposed in a region overlapping the first bonding portion 501 in the vertical direction. The first conductive portion 610 may overlap the first opening h11 in the vertical direction. The first conductive portion 610 may overlap the first frame 110 in the vertical direction. The first conductive portion 610 may be disposed on the lower surface of the first bonding portion 501. The first conductive portion 610 may be in direct contact with the lower surface of the first bonding portion 501. A lower surface of the first conductive portion 610 may be positioned below the upper surface of the body 130. In addition, the first conductive portion 610 may be disposed on a side surface of the first bonding portion 501. The first conductive portion 610 may be disposed on a part or an entire region of the side surface of the first bonding portion 501. The first conductive portion 610 may be in direct contact with the side surface of the first bonding portion 501. In addition, the first conductive portion 610 may be disposed on a lower surface of the light emitting device 500. The first conductive portion 610 may be in direct contact with the lower surface of the light emitting device 500. In addition, the first conductive portion 610 may be disposed in the first opening h11. The first conductive portion 610 may be in direct contact with an inner surface of the first opening h11. The first conductive portion 610 may be disposed on the first frame 110. The first conductive portion 610 may be disposed on the first frame 110 exposed to the lower surface of the first opening h11. The first conductive portion 610 may be in direct contact with the upper surface of the first frame 110 exposed to the lower surface of the first opening h11.

The first conductive portion 610 may be disposed to surround the entire region of the first bonding portion 501 exposed on the lower surface of the light emitting device 500. In detail, the first conductive portion 610 may be disposed to surround the entire lower surface and side surface of the first bonding portion 501. That is, a major axis length d2 of the first conductive portion 610 may be longer than a major axis length d1 of the first bonding portion 501, and may correspond to a width in a horizontal direction of the first opening h11. Accordingly, the major axis length d1 of the first bonding portion 501 may be smaller than the width in the horizontal direction of the first opening h11. Here, the major axis lengths d1 and d2 of the first bonding portion 501 and the first conductive portion 610 may refer to the width in the horizontal direction. One side surface of the first conductive portion 610 may be disposed on a plane different from one side surface of the first bonding portion 501. An area of the lower surface of the first conductive portion 610 may be larger than an area of the lower surface of the first bonding portion 501. The first bonding portion 501 may not be visually recognized from the outside by the first conductive portion 610. In addition, the major axis length d2 of the first conductive portion 610 may be shorter than or equal to a length of the first frame 110 exposed to a lower surface of the first opening h11.

The first conductive portion 610 may contain at least one of Ag, Au, Sn, Cu, AgSn, AuSn, and alloys of the above-described materials. Preferably, the first conductive portion 610 may contain AgSn. The first conductive portion 610 may contain AgSn having a Sn ratio of about 2% to about 4%. In detail, the first conductive portion 610 may contain AgSn having a Sn ratio of about 3% to about 4%. In more detail, the first conductive portion 610 may contain AgSn having a Sn ratio of about 3.5%. Here, % may refer to weight % (wt %).

The first conductive portion 610 may have a first thickness t4. The first conductive portion 610 may have the first thickness t4 in a region in which the lower surface of the light emitting device 500 and the first frame 110 overlap. In detail, the first conductive portion 610 may have the first thickness t4 between the lower surface of the light emitting device 500 on which the first bonding portion 501 is not disposed and the first frame 110. The first thickness t4 may be thicker than the thickness of the first bonding portion 501. The first thickness t4 of the first conductive portion 610 may be greater than or equal to the height of the first opening h11. The first thickness t4 of the first conductive portion 610 may be about 30 µm or less. In detail, the first thickness t4 of the first conductive portion 610 may be about 5 µm to about 30 µm.

In addition, the first conductive portion 610 may have a second thickness t5. The first conductive portion 610 may have the second thickness t5 between the first bonding portion 501 and the first frame 110. The first conductive portion 610 may have the second thickness t5 in a region in which the first bonding portion 501 and the first frame 110 overlap in the vertical direction. The second thickness t5 may be thicker than the thickness of the first bonding portion 501. The second thickness t5 of the first conductive portion 610 may be smaller than the first thickness t4. Accordingly, the second thickness t5 of the first conductive portion 610 may be smaller than the height of the first opening h11. The second thickness t5 of the first conductive portion 501 may be about 20 µm or less. In detail, the second thickness t5 of the first conductive portion 501 may be about 15 µm or less.

In addition, the first conductive portion 610 may be disposed on the side surface of the first bonding portion 501. The first conductive portion 610 may have a first width d3 on the side surface of the first bonding portion 501. The first width d3 may refer to a horizontal width. The first width d3 may correspond to a distance between the side surface of the first bonding portion 501 and the inner side surface of the first opening h11. The first width d3 of the first conductive portion 610 may be about 20 µm or less. In detail, the first width d3 of the first conductive portion 501 may be about 15 µm or less. The first width d3 of the first conductive portion 501 may correspond to the second thickness t5.

When each of the first thickness t4, the second thickness t5, and the first width d3 of the first conductive portion 610 is less than the above-described range, the first bonding portion 501 and the first frame 110 may not be electrically connected. In addition, when each of the first thickness t4, the second thickness t5, and the first width d3 exceed the above-described range, the thickness of the first conductive portion 610 may be increased to increase the total thickness of the package.

The second conductive portion 620 may be disposed between the second bonding portion 502 of the light emitting device 500 and the second frame 120. The second conductive portion 620 may be disposed in a region overlapping the second bonding portion 502 in the vertical direction. The second conductive portion 620 may overlap the second opening h12 in the vertical direction. The second conductive portion 620 may overlap the second frame 120 in the vertical direction. The second conductive portion 620 may be disposed on the lower surface of the second bonding portion 502. The second conductive portion 620 may be in direct contact with the lower surface of the second bonding portion 502. A lower surface of the second conductive portion 620 may be positioned below the upper surface of the body 130. In addition, the second conductive portion 620 may be disposed on a side surface of the second bonding portion 502. The second conductive portion 620 may be disposed on a part or the entire region of the side surface of the second bonding portion 502. The second conductive portion 620 may be in direct contact with the side surface of the second bonding portion 502. The second conductive portion 620 may be in direct contact with the side surface of the second bonding portion 502. In addition, the second conductive portion 620 may be disposed on the lower surface of the light emitting device 500. The second conductive portion 620 may be in direct contact with the lower surface of the light emitting device 500. In addition, the second conductive portion 620 may be disposed in the second opening h12. The second conductive portion 620 may be in direct contact with an inner surface of the second opening h12. The second conductive portion 620 may be disposed on the second frame 120. The second conductive portion 620 may be disposed on the second frame 120 exposed to the lower surface of the second opening h12. The second conductive portion 620 may be in direct contact with the upper surface of the second frame 120 exposed to the lower surface of the second opening h12.

The second conductive portion 620 may be disposed to surround the entire region of the second bonding portion 502 exposed to the lower surface of the light emitting device 500. In detail, the second conductive portion 620 may be disposed to surround the entire lower surface and side surface of the second bonding portion 502. That is, a major axis length d2 of the second conductive portion 620 may be longer than a major axis length d1 of the second bonding portion 502, and may correspond to a width in the horizontal direction of the second opening h12. Accordingly, the major axis length d1 of the second bonding portion 502 may be smaller than the width in the horizontal direction of the first opening h11. Here, the major axis lengths d1 and d2 of the second bonding portion 502 and the second conductive portion 620 may refer to a width in the horizontal direction. One side surface of the second conductive portion 620 may be disposed on a plane different from one side surface of the second bonding portion 502. An area of the lower surface of the second conductive portion 620 may be larger than an area of the lower surface of the second bonding portion 502. The second bonding portion 502 may not be visually recognized from the outside by the second conductive portion 620. In addition, the major axis length d2 of the second conductive portion 620 may be shorter than or equal to a length of the second frame 120 exposed to the lower surface of the second opening h12.

The second conductive portion 620 may contain at least one of Ag, Au, Sn, Cu, AgSn, AuSn, and an alloy of the above-described materials. Preferably, the second conductive portion 620 may contain AgSn. The second conductive portion 620 may contain AgSn having a Sn ratio of about 2% to about 4%. In detail, the second conductive portion 620 may contain AgSn having a Sn ratio of about 3% to about 4%. In more detail, the second conductive portion 620 may contain AgSn having a Sn ratio of about 3.5%. Here, % may refer to weight % (wt %). The second conductive portion 620 may contain the same material as the first conductive portion 610, and may include a material having the same composition.

In addition, although not shown in the drawing, the second conductive portion 620 may have a thickness and a width corresponding to the first conductive portion 610. For example, the second conductive portion 620 may have a first thickness t4. The second conductive portion 620 may have the first thickness t4 in a region in which the lower surface of the light emitting device 500 and the second frame 120 overlap. In detail, the second conductive portion 620 may have the first thickness t4 between the lower surface of the light emitting device 500 on which the second bonding portion 502 is not disposed and the second frame 120. The first thickness t4 may be thicker than the thickness of the second bonding portion 502. The first thickness t4 of the second conductive portion 620 may be greater than or equal to the height of the second opening h12. The first thickness t4 of the second conductive portion 620 may be about 30 µm or less. In detail, the first thickness t4 of the second conductive portion 620 may be about 5 µm to about 30 µm.

In addition, the second conductive portion 620 may have a second thickness t5. The second conductive portion 620 may have the second thickness t5 between the second bonding portion 502 and the second frame. The second conductive portion 620 may have the second thickness t5 in a region in which the second bonding portion 502 and the second frame 120 overlap in the vertical direction. The second thickness t5 may be thicker than the thickness of the second bonding portion 502. The second thickness t5 of the second conductive portion 620 may be smaller than the first thickness t4. Accordingly, the second thickness t5 of the second conductive portion 620 may be smaller than the height of the first opening h11. The second thickness t5 of the second conductive portion 620 may be about 20 µm or less. In detail, the second thickness t5 may be about 15 µm or less.

In addition, the second conductive portion 620 may be disposed on the side surface of the second bonding portion 502. The second conductive portion 620 may have a first width d3 on the side surface of the second bonding portion 502. The first width d3 may refer to a horizontal width. The first width d3 may correspond to a distance between the side surface of the second bonding portion 502 and the inner surface of the second opening h12. The first width d3 of the second conductive portion 620 may be about 20 µm or less. In detail, the first width d3 of the second conductive portion

620 may be about 15 μm or less. The first width d3 of the second conductive portion 620 may correspond to the second thickness t5.

When each of the first thickness t4, the second thickness t5, and the first width d3 of the second conductive portion 620 is less than the above-described range, the second bonding portion 502 and the second frame 120 may not be electrically connected. In addition, when each of the first thickness t4, the second thickness t5, and the first width d3 of the second conductive portion 620 exceed the above-described range, the thickness of the second conductive portion 620 may be increased to increase the total thickness of the package.

The first conductive portion 610 may be disposed on the first bonding portion 501. The first conductive portion 610 may be deposited on the lower surface and the side surface of the first bonding portion 501. In addition, the second conductive portion 620 may be disposed on the second bonding portion 502. The second conductive portion 620 may be deposited on the lower surface and the side surface of the second bonding portion 502. Each of the first and second conductive portions 610 and 620 may be formed by plating, physical vapor deposition (PVD), or the like. For example, the first and second conductive portions 610 and 620 may be formed on each of the bonding portions 501 and 502 by electro plating, electroless plating, sputtering, e-beam evaporation, thermal evaporation, or the like. The first conductive portion 610 may be connected to the first frame 110 after being deposited on the first bonding portion 501. In addition, the second conductive portion 620 may be connected to the second frame 120 after being deposited on the second bonding portion 502.

In addition, when each of the first and second conductive portions 610 and 620 is connected to the first and second frames 110 and 120, a flux may be disposed on the first and second frames 110 and 120, respectively. In detail, the flux may be disposed on the upper surface of each of the frames 110 and 120 facing the lower surface of the light emitting device 500. For example, the flux may be disposed on the lower surface of the first opening h11 and the lower surface of the second opening h12. The flux may contain reducing materials such as rosin, resin, inorganic acid, and organic acid. The flux may serve to fix the conductive portions 610 and 620 on the frames 110 and 120. Thereafter, the conductive portions 610 and 620 and the frames 110 and 120 may be fixed by performing thermal compression or the like, and the conductive portions 610 and 620 and the frames 110 and 120 may be electrically connected. In this case, the conductive portions 610 and 620 may be in direct contact with the frames 110 and 120. The flux may be removed after the conductive portions 610 and 620 and the frames 110 and 120 are coupled.

A first resin 210 may be disposed on the package body 100. The first resin 210 may be disposed between the light emitting device 500 and the body 130. The first resin 210 may be disposed between the upper surface of the body 130 and a rear surface of the light emitting device 500. The first resin 210 may be disposed between the first bonding portion 501 and the second bonding portion 502 of the light emitting device 500. The first resin 210 may be disposed between the first conductive portion 610 and the second conductive portion 620. The first resin 210 may be disposed between the first opening h11 and the second opening h12.

The first resin 210 may include an adhesive material and/or a reflective material. For example, the first resin 210 may include at least one of an epoxy-based material, a silicone-based material, and a hybrid material containing the epoxy-based material and the silicone-based material. Further, when the first resin 210 includes a reflective function, the adhesive may contain white silicone.

The body 130 may include a concave portion. For example, the upper surface of the body 130 may be formed with at least one concave portion recessed toward a lower surface of the body 130. The concave portion may be disposed on the lower surface of the light emitting device 500. The entire region of the concave portion may overlap the light emitting device. The first resin 210 may be provided in the concave portion. A supply position and a supply amount of the first resin 210 may be controlled by the concave portion. The first resin 210 may be adhered to the light emitting device 500 and the body 130. The first resin 210 may be in contact with the first conductive portion 610 and the second conductive portion 620. For example, the first resin 210 may be in direct contact with an outer surface of the first conductive portion 610 and an outer surface of the second conductive portion 620.

The first resin 210 may enhance adhesive force and holding force of a lower portion of the light emitting device 500. In addition, the first resin 210 may be formed of a reflective resin material to diffuse light, thereby improving reflection efficiency.

A second resin 220 may be further disposed on the package body 100. The second resin 220 may be disposed on the body 130 disposed on a lower surface of the cavity 170. The second resin 220 may be disposed outside the first and second openings h11 and h12. The second resin 220 may be disposed around the light emitting device 500.

The second resin 220 may include an adhesive material and/or a reflective material. For example, the second resin 220 may include at least one of an epoxy-based material, a silicone-based material, and a hybrid material containing the epoxy-based material and the silicone-based material. Further, when the second resin 220 includes a reflective function, the adhesive may contain white silicone.

The second resin 220 may contact a side surface of the light emitting device 500. Accordingly, the second resin 220 may enhance the side adhesion of the light emitting device 500 and improve reflection efficiency.

The light emitting device package 1000 may further include a molding portion 300. The molding portion 300 may be provided on the body 130 and the light emitting device 500. The molding portion 400 may be disposed in the cavity 170 provided by the upper body 135. The molding portion 300 may be disposed surrounding the light emitting device 500.

The molding portion 300 may include an insulating material. In addition, the molding portion 300 may include a wavelength converting means configured to receive light emitted from the light emitting device 500 and provide wavelength-converted light. For example, the molding portion 300 may include at least one selected from the group consisting of a phosphor, a quantum dot, and the like. The light emitting device 500 may emit yellow, blue, green, red, white, infrared, and ultraviolet light. The phosphor or quantum dot may emit blue, green, and red light. The molding portion 300 may not be formed.

The phosphor disposed inside or below the molding portion 300 may include a phosphor of a fluoride compound, for example, at least one of an MGF-based phosphor, a KSF-based phosphor, and a KTF-based phosphor. The phosphor may emit light having different peak wavelengths, and may emit light emitted from the light emitting device at different peak wavelengths of yellow and red or different reds. One of the phosphors may include a red phosphor. The red phosphor may have a wavelength range from 610 nm to 650 nm, and the wavelength may have a full width at half maximum of less than 10 nm. The red phosphor may include a fluoride-based phosphor. The fluoride-based phosphor may contain at least one of KSF-based red $K_2SiF_6$:$Mn^{4+}$, $K_2TiF_6$:$Mn^{4+}$, $NaYF_4$:$Mn^{4+}$, $NaGdF_4$:$Mn^{4+}$, and $K_3SiF_7$:$Mn^{4+}$. The KSF-based phosphor may have, for example, an empirical formula of $KaSi_{1-c}Fb$:$Mn^{4+}{}_c$, where the a satisfies 1≤a≤2.5, the b satisfies 5≤b≤6.5, and the c satisfies 0.001≤c≤0.1. Further, the fluoride-based red phosphor may be coated with a fluoride containing no Mn respectively, or may further contain an organic material coating on a surface of the phosphor or a surface of the fluoride coating containing no Mn in order to improve reliability at high temperature and high humidity. In case of the fluoride-based red phosphor as described above, unlike other phosphors, it may realize a narrow full width at half maximum of 10 nm or less, and thus may be utilized in a high-resolution device.

The phosphor composition according to the embodiment should basically conform to stoichiometry, and each element may be replaced with another element in each group on the periodic table. For example, Sr may be replaced with Ba, Ca, Mg, etc. of the alkaline earth (II) group, and Y may be replaced with Tb, Lu, Sc, Gd, etc. of the lanthanum series. In addition, Eu or the like as an activator may be replaced with Ce, Tb, Pr, Er, Yb, etc. depending on a desired energy level, and the activator alone, a sub-activator to modify properties, or the like may be applied additionally.

The quantum dot phosphor may contain the Group II-VI or Group III-V compound semiconductors, and may emit red light. The quantum dot may be, for example, ZnS, ZnSe, ZnTe, CdSe, CdTe, GaN, GaP, GaAs, GaSb, InP, InAs, InAsb, AlS, AlP, AlAs, PbS, PbSe, Ge, Si, CuInS2, CuInS2, etc., and a combination thereof. When the light emitting device package 1000 according to the embodiment includes a light emitting device that emits ultraviolet rays (UV), the molding portion 300 may be omitted.

That is, in the embodiment, the conductive portions 610 and 620 may be formed on the bonding portions 501 and 502 of the light emitting device 500, and it is possible to prevent voids from being formed between the frames 110 and 120 and the conductive portions 610 and 620. Accordingly, it is possible to prevent cracks due to thermal shock or the like from occurring between the frames 110 and 120 and the conductive portions 610 and 620.

In addition, in the embodiment, the conductive portions 610 and 620 are formed on the bonding portions 501 and 502 of the light emitting device 500 in advance, so that the light emitting device 500 may be easily connected on the frames 110 and 120. In detail, as the size of the light emitting device is gradually reduced, there is a difficulty in soldering between the small light emitting device 500 and the frames 110 and 120. However, in the embodiment, as the conductive portions 610 and 620 are formed in advance, it is possible to prevent soldering defects such as alignment problems, formation of voids, and cracks between the light emitting device 500 and the frames 110 and 120.

In addition, the conductive portions 610 and 620 may surround the side and lower surfaces of the bonding portions 501 and 502, thereby improving a coupling force between the bonding portions 501 and 502 and the conductive portions 610 and 620 and effectively discharging heat emitted from the light emitting device 500. Accordingly, the embodiment may improve heat dissipation characteristics of the light emitting device package.

Figure 5:
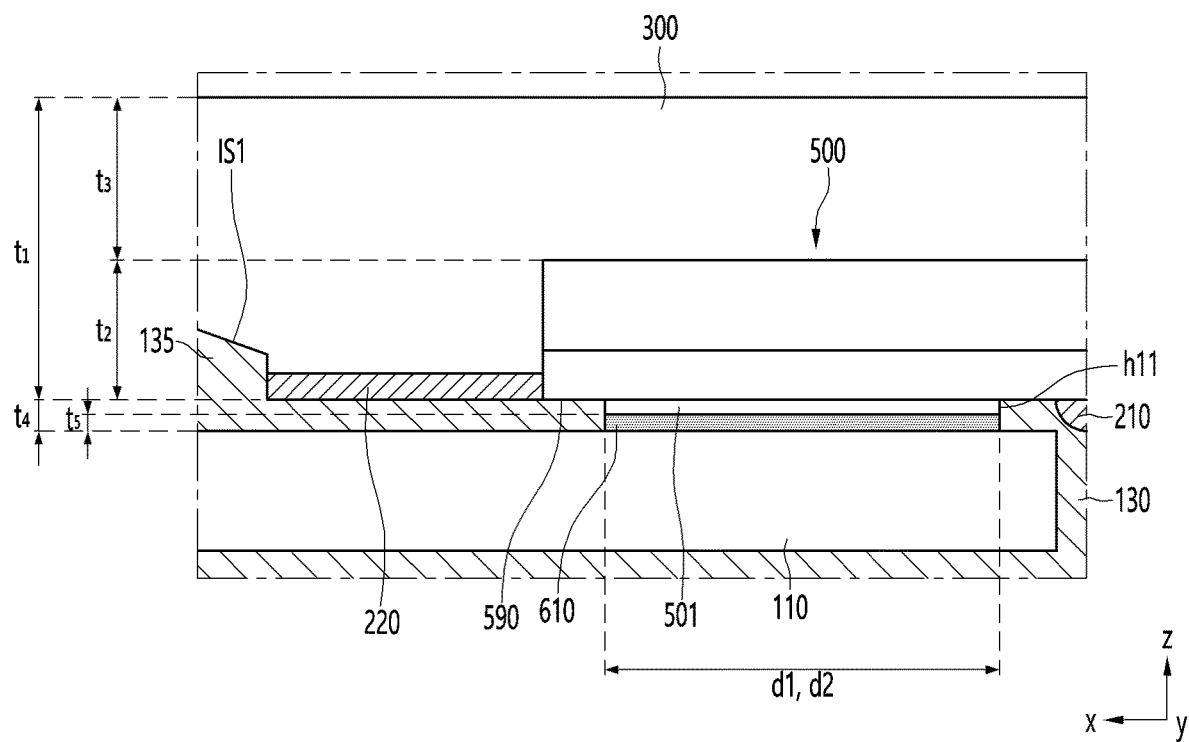
FIGS. 5 and 6 are views showing a modified example of FIG. 4.
Figure 6:
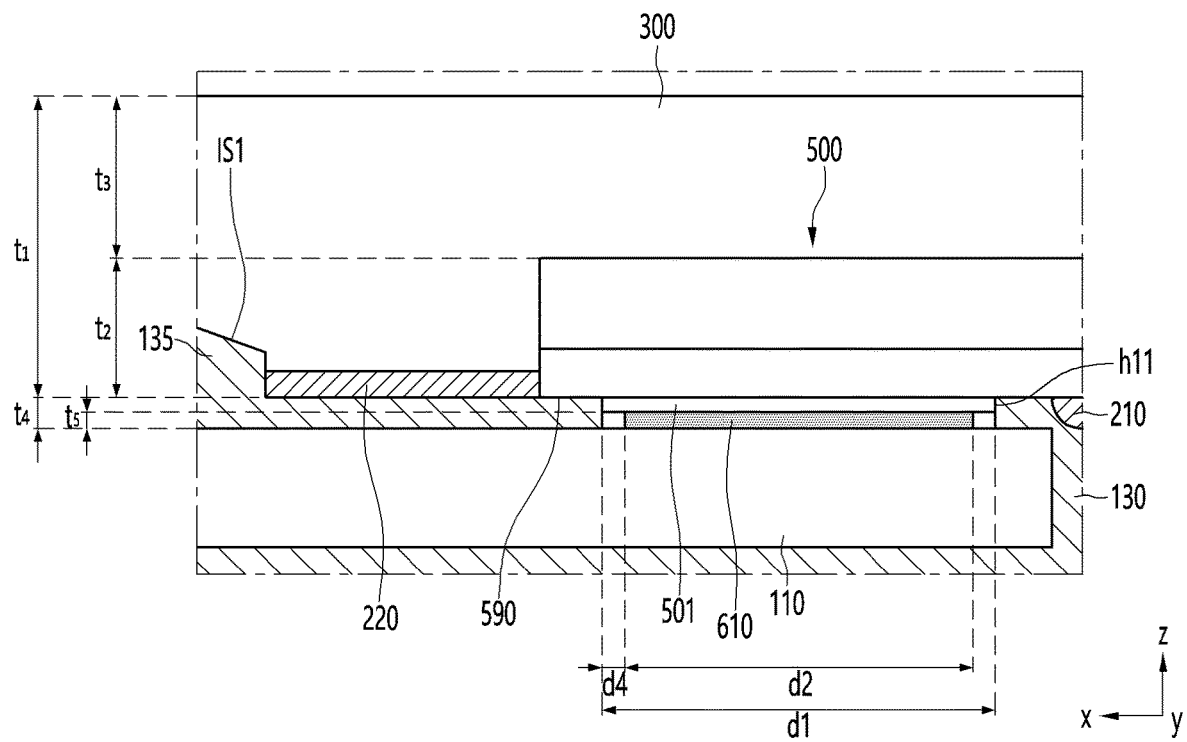

FIGS. 5 and 6 are views showing a modified example of FIG. 4. Referring to FIG. 5, the first conductive portion 610 may be disposed between the first bonding portion 501 of the light emitting device 500 and the first frame 110. The first conductive portion 610 may be disposed in a region overlapping the first bonding portion 501 in the vertical direction. The first conductive portion 610 may overlap the first opening h11 in the vertical direction. The first conductive portion 610 may overlap the first frame 110 in the vertical direction. The first conductive portion 610 may be disposed on the lower surface of the first bonding portion 501. The first conductive portion 610 may be in direct contact with the lower surface of the first bonding portion 501. In addition, the first conductive portion 610 may be disposed to be spaced apart from the side surface of the first bonding portion 501. In addition, the first conductive portion 610 may be disposed to be spaced apart from the lower surface of the light emitting device 500. The first conductive portion 610 may be disposed on the first frame 110. The first conductive portion 610 may be disposed on the first frame 110 exposed to the lower surface of the first opening h11. The first conductive portion 610 may be in direct contact with the upper surface of the first frame 110 exposed to the lower surface of the first opening h11.

The first conductive portion 610 may be disposed on the entire region of the lower surface of the first bonding portion 501. The major axis length d2 of the first conductive portion 610 may correspond to the major axis length d1 of the first bonding portion 501, and may correspond to the width in the horizontal direction of the first opening h11. Accordingly, the major axis length d1 of the first bonding portion 501 may correspond to the width in the horizontal direction of the first opening h11. Here, the major axis lengths d1 and d2 of the first bonding portion 501 and the first conductive portion 610 may refer to the width in the horizontal direction. One side surface of the first conductive portion 610 may be disposed on the same plane as one side surface of the first bonding portion 501. One side surface of the first conductive portion 610 may be disposed on the same plane as the inner surface of the first opening h11. Accordingly, an area of an upper surface of the first conductive portion 610 may correspond to the area of the lower surface of the first bonding portion 501. In addition, the major axis length d2 of the first conductive portion 610 may be shorter than or equal to the length of the first frame 110 exposed to the lower surface of the first opening h11.

The first conductive portion 610 may have the second thickness t5. The first conductive portion 610 may have the second thickness t5 between the first bonding portion 501 and the first frame 110. The second thickness t5 of the first conductive portion 610 may be thicker than the thickness of the first bonding portion 501. The second thickness t5 of the first conductive portion 501 may be about 20 µm or less. In detail, the second thickness t5 of the first conductive portion 501 may be about 15 µm or less.

In addition, although not shown in the drawing, the second conductive portion 620 may be disposed between the second bonding portion 502 of the light emitting device 500 and the second frame 120. The second conductive portion 620 may be disposed in a region overlapping the second bonding portion 502 in the vertical direction. The second conductive portion 620 may overlap the second opening h12 in the vertical direction. The second conductive portion 620 may overlap the second frame 120 in the vertical direction. The second conductive portion 620 may be disposed on the lower surface of the second bonding portion 502. The second conductive portion 620 may be in direct contact with the lower surface of the second bonding portion 502. In addition, the second conductive portion 620 may be disposed on the lower surface of the light emitting device 500. The second conductive portion 620 may be disposed to be spaced apart from the lower surface of the light emitting device 500. The second conductive portion 620 may be disposed on the second frame 120. The second conductive portion 620 may be disposed on the second frame 120 exposed to the lower surface of the second opening h12. The second conductive portion 620 may be in direct contact with the upper surface of the second frame 120 exposed to the lower surface of the second opening h12.

The second conductive portion 620 may be disposed on the entire region of the lower surface of the second bonding portion 502. The major axis length d2 of the second conductive portion 620 may correspond to the major axis length d1 of the second bonding portion 502, and may correspond to the width in the horizontal direction of the second opening h12. Accordingly, the major axis length d1 of the second bonding portion 502 may correspond to the width in the horizontal direction of the first opening h11. Here, the major axis lengths d1 and d2 of the second bonding portion 502 and the second conductive portion 620 may refer to the width in the horizontal direction. One side surface of the second conductive portion 620 may be disposed on a plane different from one side surface of the second bonding portion 502. One side surface of the second conductive portion 620 may be disposed on the same plane as the inner surface of the second opening h12. Accordingly, an area of an upper surface of the second conductive portion 620 may correspond to the area of the lower surface of the second frame 120. In addition, the major axis length d2 of the second conductive portion 620 may be shorter than or equal to the length of the second frame 120 exposed to the lower surface of the second opening h12.

The second conductive portion 620 may have the second thickness t5. The second conductive portion 620 may have the second thickness t5 between the second bonding portion 502 and the second frame. The second thickness t5 may be thicker than the thickness of the second bonding portion 502. The second thickness t5 of the second conductive portion 620 may be about 20 μm or less. In detail, the second thickness t5 may be about 15 μm or less.

When the second thickness t5 of each of the first and second conductive portions 610 and 620 is less than the above-described range, the bonding portions 501 and 502 and the frames 110 and 120 may not be connected. In addition, when the second thickness t5 exceed the above-described range, the thickness of the conductive portions 610 and 620 may be increased to increase the total thickness of the package.

That is, in the embodiment, the conductive portions 610 and 620 may be formed on the bonding portions 501 and 502 of the light emitting device 500, and it is possible to prevent voids from being formed between the frames 110 and 120 and the conductive portions 610 and 620. Accordingly, it is possible to prevent cracks due to thermal shock or the like from occurring between the frames 110 and 120 and the conductive portions 610 and 620.

In addition, in the embodiment, the conductive portions 610 and 620 are formed on the bonding portions 501 and 502 of the light emitting device 500 in advance, so that the light emitting device 500 may be easily connected on the frames 110 and 120. In detail, as the size of the light emitting device is gradually reduced, there is a difficulty in soldering between the small light emitting device 500 and the frames 110 and 120. However, in the embodiment, as the conductive portions 610 and 620 are formed in advance, it is possible to prevent soldering defects such as alignment problems, formation of voids, and cracks between the light emitting device 500 and the frames 110 and 120.

In addition, the conductive portions 610 and 620 is in direct contact with the lower surfaces of the bonding portions 501 and 502 and have an area corresponding to the lower surfaces of the bonding portions 501 and 502, thereby effectively discharging heat emitted from the light emitting device 500. Accordingly, the embodiment may improve the heat dissipation characteristics of the light emitting device package.

Referring to FIG. 6, the first conductive portion 610 may be disposed between the first bonding portion 501 of the light emitting device 500 and the first frame 110. The first conductive portion 610 may be disposed in the region overlapping the first bonding portion 501 in the vertical direction. The first conductive portion 610 may overlap the first opening h11 in the vertical direction. The first conductive portion 610 may overlap the first frame 110 in the vertical direction. The first conductive portion 610 may be disposed on the lower surface of the first bonding portion 501. The first conductive portion 610 may be in direct contact with the lower surface of the first bonding portion 501. In addition, the first conductive portion 610 may be disposed to be spaced apart from the side surface of the first bonding portion 501. The first conductive portion 610 may be disposed to be spaced apart from the lower surface of the light emitting device 500. The first conductive portion 610 may be disposed on the first frame 110. The first conductive portion 610 may be disposed on the first frame 110 exposed to the lower surface of the first opening h11. The first conductive portion 610 may be in direct contact with the upper surface of the first frame 110 exposed to the lower surface of the first opening h11.

The first conductive portion 610 may be disposed on a partial region of the lower surface of the first bonding portion 501. The major axis length d2 of the first conductive portion 610 may be shorter than the major axis length d1 of the first bonding portion 501, and may be shorter than the width in the horizontal direction of the first opening h11. In addition, the major length d1 of the first bonding portion 501 may correspond to the width in the horizontal direction of the first opening h11. Here, the major axis lengths d1 and d2 of the first bonding portion 501 and the first conductive portion 610 may refer to the width in the horizontal direction. One side surface of the first conductive portion 610 may be disposed on a plane different from one side surface of the first bonding portion 501. One side surface of the first conductive portion 610 may be disposed to be spaced apart from the inner surface of the first opening h11. The first conductive portion 610 and the first opening h11 may have a second width d4. In detail, a side surface of the first conductive portion 610 and the inner surface of the first opening h11 may be spaced apart by the second width d4. The second width d4 may be about 20 μm or less. In detail, the second width d4 may be about 15 μm or less. The area of the upper surface of the first conductive portion 610 may be smaller than the area of the lower surface of the first bonding portion 501. In addition, the major axis length d2 of the first conductive portion 610 may be shorter than the length of the first frame 110 exposed to the lower surface of the first opening h11. The area of the lower surface of the first conductive portion 610 may be smaller than the area of the upper surface of the first frame 110 exposed to the lower surface of the first opening h11.

In addition, a part of the lower surface of the first bonding portion 501 may be exposed. In detail, as the major axis length d2 of the first conductive portion 610 is shorter than the major axis length d1 of the first bonding portion 501, a part of the lower surface of the first bonding portion 501 may be exposed. Accordingly, a gap may be formed between the first bonding portion 501 and the first frame 110. The above-described flux may be disposed in the gap, and coupling force between the first bonding portion 501, the first conductive portion 610, and the first frame 110 may be improved by the flux.

In addition, although not shown in the drawing, the second conductive portion 620 may be disposed between the second bonding portion 502 of the light emitting device 500 and the second frame 120. The second conductive portion 620 may be disposed in the region overlapping the second bonding portion 502 in the vertical direction. The second conductive portion 620 may overlap the second opening h12 in the vertical direction. The second conductive portion 620 may overlap the second frame 120 in the vertical direction. The second conductive portion 620 may be disposed on the lower surface of the second bonding portion 502. The second conductive portion 620 may be in direct contact with the lower surface of the second bonding portion 502. In addition, the second conductive portion 620 may be disposed to be spaced apart from the side surface of the second bonding portion 502. The second conductive portion 620 may be disposed to be spaced apart from the lower surface of the light emitting device 500. The second conductive portion 620 may be disposed on the second frame 120. The second conductive portion 620 may be disposed on the second frame 120 exposed to the lower surface of the second opening h12. The second conductive portion 620 may be in direct contact with the upper surface of the second frame 120 exposed to the lower surface of the second opening h12.

The second conductive portion 620 may be disposed on a partial region of the lower surface of the second bonding portion 502. The major axis length d2 of the second conductive portion 620 may be shorter than the major axis length d1 of the first bonding portion 501, and may be shorter than the width in the horizontal direction of the second opening h12. In addition, the major axis length d1 of the second bonding portion 502 may correspond to the width in the horizontal direction of the second opening h12. Here, the major axis lengths d1 and d2 of the second bonding portion 502 and the second conductive portion 620 may refer to the width in the horizontal direction. One side surface of the second conductive portion 620 may be disposed on a plane different from one side surface of the second bonding portion 502. One side surface of the second conductive portion 620 may be disposed to be spaced apart from the inner surface of the second opening h12. The second conductive portion 620 and the second opening h12 may have a second width d4. In detail, a side surface of the second conductive portion 620 and the inner surface of the second opening h12 may be spaced apart by the second width d4. The second width d4 may be about 20 μm or less. In detail, the second width d4 may be about 15 μm or less. The area of the upper surface of the second conductive portion 620 may be smaller than the area of the lower surface of the second bonding portion 502. In addition, the major axis length d2 of the second conductive portion 620 may be shorter than the length of the second frame 120 exposed to the lower surface of the second opening h12. The area of the lower surface of the second conductive portion 620 may be smaller than the area of the upper surface of the second frame 120 exposed to the lower surface of the second opening h12.

In addition, a part of the lower surface of the second bonding portion 502 may be exposed. In detail, as the major axis length d2 of the second conductive portion 620 is shorter than the major axis length d1 of the second bonding portion 502, a part of the lower surface of the second bonding portion 502 may be exposed. Accordingly, a gap may be formed between the second bonding portion 502 and the second frame 120. The above-described flux may be disposed in the gap, and the coupling force between the second bonding portion 502, the second conductive portion 620, and the second frame 120 may be improved by the flux.

That is, in the embodiment, the conductive portions 610 and 620 may be formed on the bonding portions 501 and 502 of the light emitting device 500, and it is possible to prevent voids from being formed between the frames 110 and 120 and the conductive portions 610 and 620. Accordingly, it is possible to prevent cracks due to thermal shock or the like from occurring between the frames 110 and 120 and the conductive portions 610 and 620.

In addition, in the embodiment, the conductive portions 610 and 620 are formed on the bonding portions 501 and 502 of the light emitting device 500 in advance, so that the light emitting device 500 may be easily connected on the frames 110 and 120. In detail, as the size of the light emitting device is gradually reduced, there is a difficulty in soldering between the small light emitting device 500 and the frames 110 and 120. However, in the embodiment, as the conductive portions 610 and 620 are formed in advance, it is possible to prevent soldering defects such as alignment problems, formation of voids, and cracks between the light emitting device 500 and the frames 110 and 120.

In addition, the conductive portions 610 and 620 is in direct contact with the lower surfaces of the bonding portions 501 and 502 and have an area corresponding to the lower surfaces of the bonding portions 501 and 502, thereby effectively discharging heat emitted from the light emitting device 500. Accordingly, the embodiment may improve the heat dissipation characteristics of the light emitting device package.

In addition, as areas of the conductive portions 610 and 620 are smaller than areas of the bonding portions 501 and 502, the gap may be formed between the bonding portions 501 and 502 and the frames 110 and 120, the flux may be disposed in the gap. Accordingly, the coupling force between the bonding portions 501 and 502, the conductive portions 610 and 620, and the frames may be improved.

Figure 7:
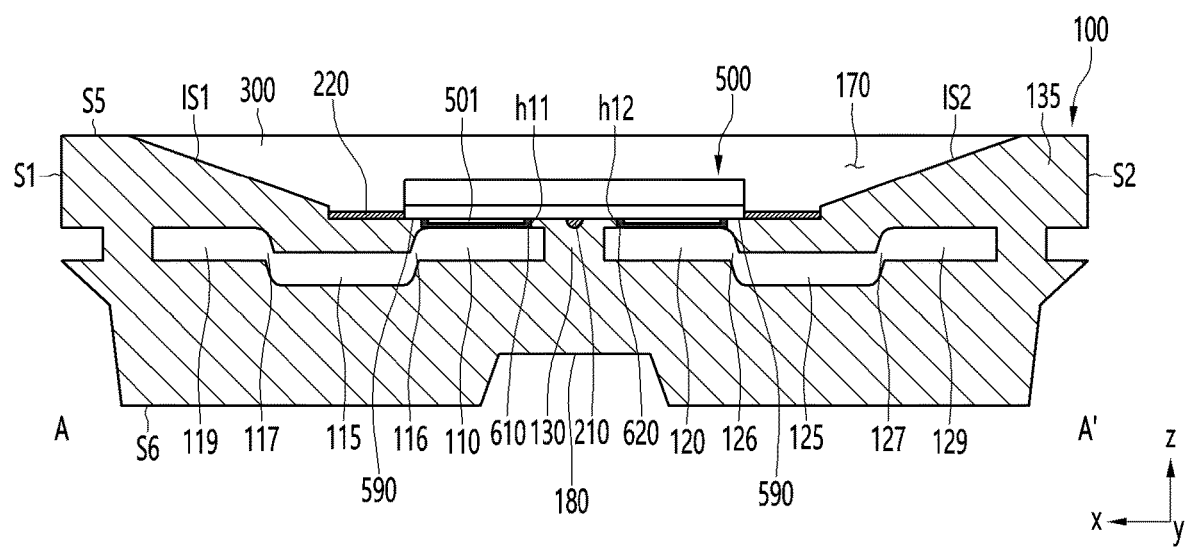
FIG. 7 is a cross-sectional view taken along line A-A' showing a modified example of the frame of the light emitting device package of FIG. 1.

FIG. 7 is a cross-sectional view taken along line A-A' illustrating a modified example of a frame in the light emitting device package of FIG. 1.

Referring to FIG. 7, the package body 100 may include a first frame 110 and a second frame 120.

The first frame 110 may be disposed on a region corresponding to the first bonding portion 501 of the light emitting device 500. The first frame 110 may be electrically connected to the first bonding portion 501. In addition, the second frame 120 may be disposed on a region corresponding to the second bonding portion 502 of the light emitting device 500. The second frame 120 may be electrically connected to the second bonding portion 502.

The first frame 110 may include a first support portion 115 that is bent from a lower surface of the cavity 170 toward the rear surface S6 of the package body 100.

The first support portion 115 may be disposed inside the package body 100. The first support portion 115 may be disposed between the lower surface of the cavity 170 and the rear surface S6 of the package body 100 without being exposed to the lower surface of the cavity 170. The first support portion 115 may be disposed closer to the lower surface of the cavity 170 than to the rear surface S6 of the package body 100. Both end portions 116 and 117 of the first support portion 115 are bent portions, and both end portions 116 and 117 may be connected to the first frame 110 and a first inner frame 119 disposed inside the package body 100. Thicknesses of both end portions 116 and 117 of the first support 115 may be thinner than a thickness of the first frame 110. In addition, the thicknesses of both end portions 116 and 117 of the first support 115 may be thinner than a thickness of the first inner frame 119.

The second frame 120 may include a second support portion 125 that is bent from the lower surface of the cavity 170 toward the rear surface S6 of the package body 100. The second support portion 125 may be disposed inside the package body 100. The second support portion 125 may be disposed between the lower surface of the cavity 170 and the rear surface S6 of the package body 100 without being exposed to the lower surface of the cavity 170. The second support portion 125 may be disposed closer to the lower surface of the cavity 170 than the rear surface S6 of the package body 100. Both end portions 126 and 127 of the second support portion 125 are bent portions, and the both end portions 126 and 127 may be connected to the first frame 110 and a second inner frame 129 disposed inside the package body 100. Thicknesses of the both end portions 126 and 127 of the second support portion 125 may be thinner than a thickness of the second frame 120. In addition, the thicknesses of the both end portions 126 and 127 of the second support portion 125 may be thinner than a thickness of the second inner frame 129.

As the package body 100 includes the support portions 115 and 125 of which both end portions are bent, a contact area between the body 130 and the first and second frames 110 and 120 may be increased. Accordingly, it is possible to improve a coupling force between the body 130, the first frame 110, and the second frame 120, thereby improving reliability of the light emitting device package 1000.

Figure 8:
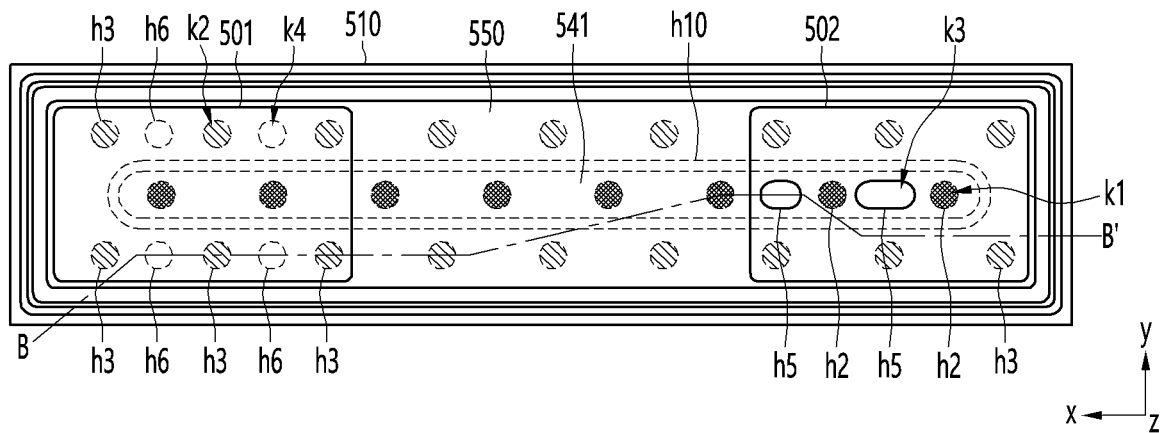
FIG. 8 is a plan view of a light emitting device according to an embodiment.
Figure 9:
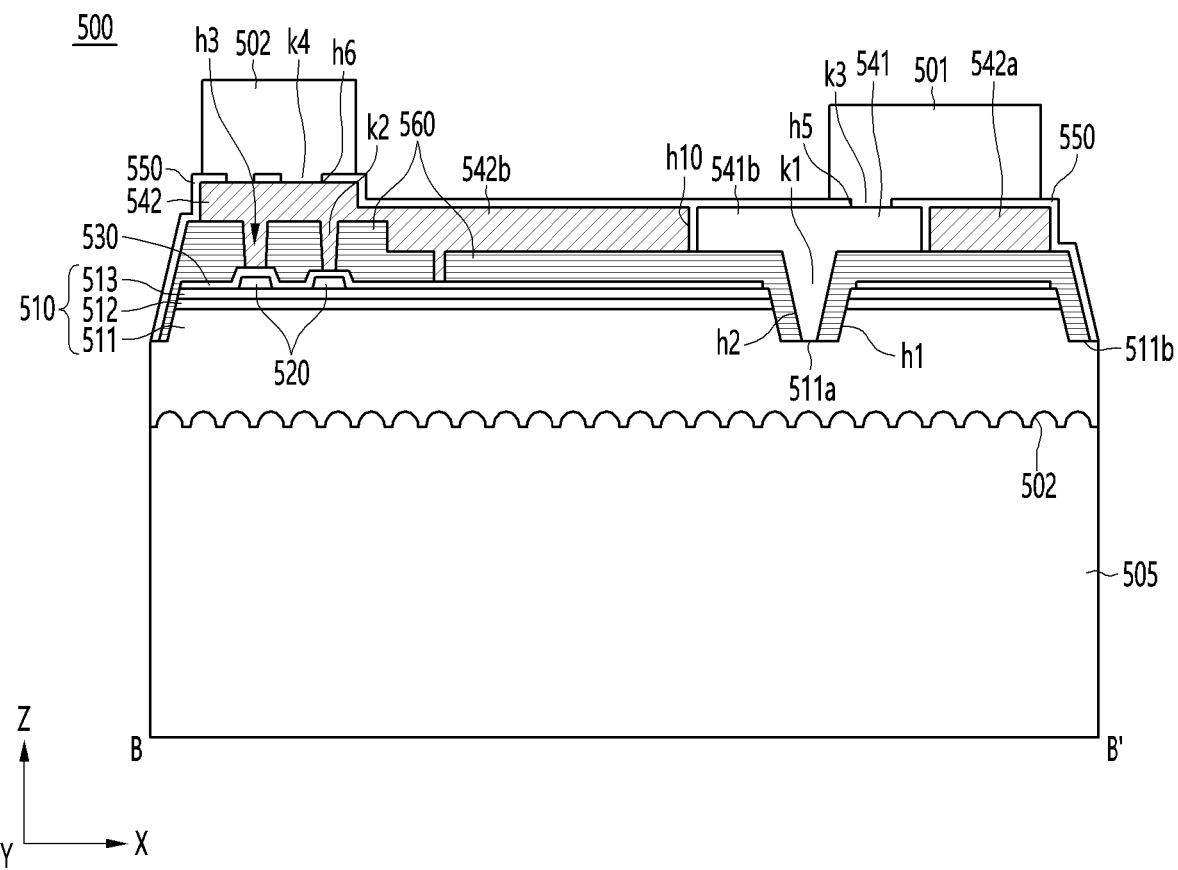
FIG. 9 is a cross-sectional view taken along line B-B' of FIG. 8.

FIG. 8 is a plan view of a light emitting device according to an embodiment, and FIG. 9 is a cross-sectional view taken along line B-B' of FIG. 8.

Referring to FIGS. 8 and 9, a light emitting device 500 according to an embodiment may include a substrate 505, a light emitting structure 510, a conductive layer 530, a reflective layer 560, a first electrode 541, a second electrode 542, a first bonding portion 501, a second bonding portion 502, and a protective layer 550. The first and second bonding portions 501 and 502 may be disposed on the light emitting structure 510. In the light emitting device 500, the first and second bonding portions 501 and 502 may be disposed on one surface of the light emitting device 500, and may be disposed inside the package in a flip chip method or may be disposed on a circuit board.

The substrate 505 may be disposed under the light emitting structure. The substrate 505 may be a translucent material or an insulating material. The substrate 505 may be selected from a group consisting a sapphire substrate ($Al_2O_3$), SiC, GaAs, GaN, ZnO, Si, GaP, InP, and Ge. For example, the substrate 505 may have a concavo-convex pattern 502 disposed on an upper surface thereof. In the concavo-convex pattern 502, a plurality of convex portions may be arranged, and a critical angle of incident light may be changed. The substrate 505 may have a convex portion or a concave portion disposed on at least one of an upper surface and a lower surface thereof. The substrate 505 may provide a surface for emitting light emitted from the inside of the light emitting device 500. The substrate 505 may be removed, but the present embodiment is not limited thereto.

The light emitting structure 510 may be provided as a compound semiconductor. The light emitting structure 510 may be provided as, for example, a Group II-VI or Group III-V compound semiconductor. As an example, the light emitting structure 510 may be provided with at least two or more elements selected from aluminum (Al), gallium (Ga), indium (In), phosphorus (P), arsenic (As), and nitrogen (N).

The light emitting structure 510 may include a plurality of compound semiconductor layers. The light emitting structure 510 may include, for example, a first conductive type semiconductor layer 511, a second conductive type semiconductor layer 513, an active layer 512 disposed between the first conductive type semiconductor layer 511 and the second conductive type semiconductor layer 513. The first conductive type semiconductor layer 511 may be disposed on the substrate 505. A single-layered or multi-layered compound semiconductor layer may be disposed between the first conductive type semiconductor layer 511 and the substrate 505. The light emitting structure 510 may emit blue, green, red, ultraviolet, and infrared light.

The first conductive type semiconductor layer 511 may be disposed under the active layer 512. The first conductive type semiconductor layer 511 may be disposed between the active layer 512 and the substrate 505. The first conductive type semiconductor layer 511 may be provided as, for example, a Group II-VI compound semiconductor or a Group III-V compound semiconductor. For example, the first conductive type semiconductor layer 511 may be provided as a semiconductor material having an empirical formula of $In_xAl_yGa_{1-x-y}N$ ($0 \leq x \leq 1$, $0 \leq y \leq 1$, $0 \leq x+y \leq 1$) or a semiconductor material having an empirical formula of $(Al_xGa_{1-x})_yIn_{1-y}P$ ($0 \leq x \leq 1$, $0 \leq y \leq 1$). For example, the first conductive type semiconductor layer 511 may be selected from the group consisting of GaN, AlN, AlGaN, InGaN, InN, InAlGaN, AlInN, AlGaAs, GaP, GaAs, GaAsP, AlGaInP, AlInP, GaInP, and the like, and an n-type dopant selected from the group consisting of Si, Ge, Sn, Se, Te, and the like may be doped. The first conductive type semiconductor layer 511 may be disposed as a single layer or multiple layers, or may include a superlattice structure.

The active layer 512 may be disposed on the first conductive type semiconductor layer 511. The active layer 512 may be in contact with the first conductive type semiconductor layer 511 and the second conductive type semiconductor layer 513. For example, the active layer 512 may be provided as the Group II-VI compound semiconductor or the Group III-V compound semiconductor. For example, the active layer 512 may be provided as the semiconductor material having the empirical formula of $In_xAl_yGa_{1-x-y}N$ ($0 \leq x \leq 1$, $0 \leq y \leq 1$, $0 \leq x+y \leq 1$) or the semiconductor material having the empirical formula of $(Al_xGa_{1-x})_yIn_{1-y}P$ ($0 \leq x \leq 1$, $0 \leq y \leq 1$). For example, the active layer 512 may be selected from the group consisting of GaN, AlN, AlGaN, InGaN, InN, InAlGaN, AlInN, AlGaAs, GaP, GaAs, GaAsP, AlGaInP, AlInP, GaInP, and the like. For example, the active layer 512 may be provided in a multi-well structure, and may include a plurality of barrier layers and a plurality of well layers. The active layer 512 may emit light of at least one of blue, green, red, ultraviolet, and infrared rays.

The second conductive type semiconductor layer 513 may be disposed on the active layer 512. The second conductive type semiconductor layer 513 may be disposed between the active layer 512 and the conductive layer 530. For example, the second conductive type semiconductor layer 513 may be provided as the Group II-VI compound semiconductor or the Group III-V compound semiconductor. For example, the second conductive type semiconductor layer 513 may be provided as the semiconductor material having the empirical formula of $In_xAl_yGa_{1-x-y}N$ ($0 \leq x \leq 1$, $0 \leq y \leq 1$, $0 \leq x+y \leq 1$) or the semiconductor material having the empirical formula of $(Al_xGa_{1-x})_yIn_{1-y}P$ ($0 \leq x \leq 1$, $0 \leq y \leq 1$). For example, the second conductive type semiconductor layer 513 may be selected from the group consisting of GaN, AlN, AlGaN, InGaN, InN, InAlGaN, AlInN, AlGaAs, GaP, GaAs, GaAsP, AlGaInP, AlInP, GaInP, and the like, and a p-type dopant selected from the group consisting of Mg, Zn, Ca, Sr, Ba, and the like may be doped. The second conductive type semiconductor layer 513 may be disposed as a single layer or multiple layers, or may include a superlattice structure.

In the light emitting structure 510 according to the embodiment, the first conductive type semiconductor layer 511 may be provided as an n-type semiconductor layer, and the second conductive type semiconductor layer 513 may be provided as a p-type semiconductor layer. Alternatively, the first conductive type semiconductor layer 511 may be provided as the p-type semiconductor layer, and the second conductive type semiconductor layer 513 may be provided as the n-type semiconductor layer. Hereinafter, for convenience of explanation, description will be made based on a case in which the first conductive type semiconductor layer 511 is provided as the n-type semiconductor layer and the second conductive type semiconductor layer 513 is provided as the p-type semiconductor layer.

The first conductive type semiconductor layer 511 may be connected to the first electrode 541. The second conductive type semiconductor layer 513 may be connected to at least one or both of the conductive layer 530 and the second electrode 542.

The light emitting structure 510 may include a plurality of first recesses h1 as shown in FIG. 9. The plurality of first recesses h1 may be a stepped region in which an upper portion 511a of the first conductive type semiconductor layer 511 is exposed from an upper surface of the light emitting structure 510. The first recesses h1 may be respectively disposed in regions corresponding to the opening h2 shown in FIG. 8. The first recess h1 may be disposed on a region in which the light emitting structure 510 and the first electrode 541 overlap. The plurality of first recesses h1 may be disposed passing through the conductive layer 530, the second conductive type semiconductor layer 513, and the active layer 512. The plurality of first recesses h1 may be disposed to be spaced apart from each other on the light emitting structure 510. The plurality of first recesses h1 may be arranged in first and second directions (x-axis and y-axis directions). The plurality of first recesses h1 may be disposed at equal distances in the first direction, and may be disposed at equal distances in the second direction.

The first recess h1 may have an upper width or an upper area larger than a lower width or a lower area. An upper shape of the first recess h1 may have a polygonal shape or a circular shape.

The light emitting structure 510 may include an outer portion 511b stepped around an outer periphery. The outer portion 511b may be disposed more inside than a side surface of the substrate 505, and may be disposed lower than the upper surface of the light emitting structure 510.

A conductive layer 530, a current diffusion layer 520, a first electrode 541, a second electrode 542, and a reflective layer 560 may be disposed on the light emitting structure 510.

The conductive layer 530 may be disposed on the light emitting structure 530. The conductive layer 530 may be disposed on the second conductive type semiconductor layer 513. The conductive layer 530 may be connected to the second electrode 542, and may diffuse current. For example, the conductive layer 530 may contain at least one selected from the group consisting of metal, metal oxide, and metal nitride. The conductive layer 530 may include a translucent. For example, the conductive layer 530 may contain at least one selected from the group consisting of indium tin oxide (ITO), indium zinc oxide (IZO), IZO nitride (IZON), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), $IrO_x$, $RuO_x$, $RuO_x$/ITO, $Ni/IrO_x/Au$, $Ni/IrO_x/Au/ITO$, Pt, Ni, Au, Rh, and Pd.

An area of an upper surface of the conductive layer 530 may be smaller than an area of an upper surface of the second conductive type semiconductor layer 513. The conductive layer 530 may be a transparent layer, and may be provided as a single layer or multiple layers. The conductive layer 530 may be disposed in an area of at least 80% of an area of the upper surface of the light emitting structure 510 to improve electrical characteristics of the light emitting device.

The reflective layer 560 may reflect light emitted from the light emitting structure 510. The reflective layer 560 may be formed of an insulating material and/or a metallic material. For example, the reflective layer 560 may include a distributed bragg reflector (DBR) or an omni directional reflector (ODR). For example, the reflective layer 560 may include a DBR structure in which first and second layers having different refractive indices are alternately stacked. The reflective layer 560 may alternately stack at least two layers having different refractive indices, and the first layer may be any one of $Al_2O_3$, $TiO_2$, and $SiO_2$, and the second layer may be another one of $Al_2O_3$, $Ta_2O_5$, and $SiO_2$.

The reflective layer 560 may be disposed on the outer portion 511b of the light emitting structure 510. A bottom of the outer portion 511b may be disposed lower than an upper surface of the active layer 512. An upper portion of an outer surface of the light emitting structure 510 may be provided as an inclined surface on the outer portion 511b.

Since the reflective layer 560 covers the outer portion 511b of the light emitting structure 510, the active layer 512 of the light emitting structure 510 may be prevented from being exposed. Since the reflective layer 560 extends to a side surface of the active layer 512 of the light emitting structure 510, light reflection efficiency may be improved.

In addition, a part of the reflective layer 560 may be disposed on the plurality of first recesses h1. In addition, the reflective layer 560 may include the opening h2 corresponding to the upper portion 511a of the first conductive type semiconductor layer 511 and connected to the upper portion 511a. The opening h2 may have a wide upper portion and a narrow lower portion. A first contact portion k1 of the first electrode 541 may be disposed in the opening h2, respectively. The first contact portion k1 may be in contact with the upper portion 511a of the first conductive type semiconductor layer 511. Accordingly, the first conductive type semiconductor layer 511 may be electrically connected to the first electrode 541.

In addition, the reflective layer 560 may include a plurality of through-holes h3. A second contact portion k2 of the second electrode 542 may be disposed in the through-hole h3. The plurality of through-holes h3 may be disposed in an area overlapping the second electrode 542 in the vertical direction. As shown in FIG. 8, the plurality of through-holes h3 may be arranged in the first direction, and the plurality of through-holes h3 may be arranged in the second direction. The through-holes h3 may be disposed at equal distances in the first direction, and may be disposed at equal distances in the second direction. Thus, when the through-holes h3 are arranged at uniform distances along each direction, a current may be supplied in a uniform distribution through the second contact portion k2.

The current diffusion layer 520 may be disposed on the light emitting structure 510. The current diffusion layer 520 may be disposed on the second conductive type semiconductor layer 513. The current diffusion layer 520 may contact an upper surface of the second conductive type semiconductor layer 513. The current diffusion layer 520 may be disposed between the second conductive type semiconductor layer 513 and the conductive layer 530. The current diffusion layer 520 may be disposed in a region corresponding to the second contact portion k2 of the second electrode 542 among regions between the conductive layer 530 and the light emitting structure 510. The current diffusion layer 520 may break or block an input current to diffuse in the horizontal direction through the conductive layer 530. For example, the current diffusion layer 520 may be disposed as an oxide or a nitride, or may be formed of an insulating material or a metal material. The current diffusion layer 520 may overlap the second contact portion k2 in the vertical direction. The current diffusion layer 520 may be dispersed and disposed in a plurality of regions. The current diffusion layer 520 may prevent a current from being concentrated under the second electrode 542.

The through-hole h3 of the reflective layer 560 may be disposed to overlap the current diffusion layer 520 in the vertical direction. Accordingly, a current injected through the second contact portion k2 may be diffused through the current diffusion layer 520. The current diffusion layer 520 may be disposed in a dot shape, and may be disposed in a region overlapping the first and second bonding portions 501 and 502, or may be disposed under the through-hole h3, respectively.

In the electrode structure, the first electrode 541 and the second electrode 542 may be disposed on the reflective layer 560. The first electrode 541 may be disposed on the reflective layer 560. The first electrode 541 may be in contact with a surface of the reflective layer 560. The second electrode 542 may be in contact with the surface of the reflective layer 560. The first electrode 541 may include the first contact portion k1. The first contact portion k1 may protrude through the opening h2, and may be spaced apart from each other. The first contact portion k1 may be connected to and be in contact with the first conductive type semiconductor layer 511 through the opening h2 of the reflective layer 560.

The first electrode 541 may be disposed in a first bonding region between the light emitting structure 510 and the first bonding portion 501. The first electrode 541 may extend from the first bonding region toward a second bonding region between the light emitting structure 510 and the second bonding portion 502. The first electrode 541 may include a first extension portion 541a extending to the second bonding region and a second extension portion 541b connected between the first electrode 541 and the first extension portion 541a. The first extension portion 541a and the second extension portion 541b may be connected to the first electrode 541. The first and second extension portions 541a and 541b may extend with a long length from the first electrode 541 in the first direction.

The first electrode 541 may be disposed in an open region h10 of the second electrode 542. The first electrode 541 and the second electrode 542 may be spaced apart from each other. The first electrode 541 and the second electrode 542 may be separated or insulated from each other by the protective layer 550.

The second electrode 542 may extend toward the first bonding region or a first bonding portion 571 from the second bonding region below the second bonding portion 572. The second electrode 542 may include a third extension portion 542a extending below the first bonding portion 571 and a fourth extension portion 542b extending from the second electrode 542 toward the third extension portion 542a. The third and fourth extension portions 542a and 542b may be connected to the second electrode 542. The third and fourth extension portions 542a and 542b may be disposed in the entire region of the reflective layer 560 from the second electrode 542. The first and second electrodes 541 and 542 may be disposed not to overlap each other.

The second electrode 542 may be disposed on the second conductive type semiconductor layer 513 to be electrically connected to the second conductive type semiconductor layer 513. The second electrode 542 may be electrically connected to the second conductive type semiconductor layer 513 through the through-hole h3 formed in the reflective layer 560. The second electrode 542 may be electrically connected to the second conductive type semiconductor layer 513 through the conductive layer 530. The second electrode 542 may be in direct contact with at least one of the conductive layer 530 and the second conductive type semiconductor layer 513.

The first electrode 541 and the second electrode 542 may be formed as a single-layer structure or a multi-layer structure. For example, the first electrode 541 and the second electrode 542 may be an ohmic electrode. For example, the first electrode 541 and the second electrode 542 may be formed of at least one material of ZnO, IrOx, RuOx, NiO, RuOx/ITO, Ni/IrOx/Au, and Ni/IrOx/Au/ITO, Ag, Ni, Cr, Ti, Al, Rh, Pd, Ir, Ru, Mg, Zn, Pt, Au, and Hf, or an alloy of two or more thereof. The first electrode 541 and the second electrode 542 may include the same stacked structure or the same metal.

The protective layer 550 may be disposed on the first and second electrodes 541 and 542. The protective layer 550 may be an insulating layer, and may insulate between the first and second electrodes 541 and 542. The protective layer 550 may be filled in the open region h10 to separate the first and second electrodes 541 and 542 from each other. The protective layer 550 may be disposed between the first electrode 541 and the second bonding portion 502 to insulate each other. The protective layer 550 may be disposed between the second electrode 542 and the first bonding portion 501 to insulate each other. The protective layer 550 may be provided as an insulating material. For example, the protective layer 550 may be formed of at least one material selected from the group consisting of $Si_xO_y$, $SiO_xN_y$, $Si_xN_y$, and $Al_xO_y$ (here, $1 \leq x \leq 5$, $1 \leq y \leq 5$). The protective layer 550 may extend to the outer portion 511b of the light emitting structure 510 to protect a surface of the light emitting structure 510.

The protective layer 550 may include a first open region h5, and the first open region h5 may expose a part of an upper surface of the first electrode 541. The first open region h5 may be disposed in a region in which the first bonding portion 501 and the first electrode 541 overlap in the vertical direction. The first open region h5 may be disposed so as not to overlap the opening h2 in the vertical direction. The first open regions h5 may be disposed in one or plural.

In addition, the protective layer 550 may include a second open region h6. The second open region h6 may expose a part of an upper surface of the second electrode 542. The second open region h6 may be disposed in a region in which the second bonding portion 502 and the second electrode 542 overlap each other in the vertical direction. The second open region h6 may be disposed not to overlap the through-hole h3 of the reflective layer 560 in the vertical direction. The second open region h6 may be disposed in one or plural. In this case, a number of the second open regions h6 may be greater than a number of the first open regions. Accordingly, efficiency of a current injected into the second electrode 542 may be improved.

The first bonding portion 501 and the second bonding portion 502 may be disposed on the protective layer 550. The first bonding portion 501 may be disposed to be spaced apart from the second bonding portion 502 in the first direction.

The first bonding portion 501 may be disposed on a region overlapping the first electrode 541, and the reflective layer 560 in the vertical direction. Apart k3 of the first bonding portion 501 may be in direct contact with the first electrode 541 and may be electrically connected to the first electrode 541 through the first open region h5.

The second bonding portion 502 may be disposed on the region overlapping the second electrode 542, and the reflective layer 560 in the vertical direction. Apart k4 of the second bonding portion 502 may be in direct contact with the second electrode 542 and may be electrically connected to the second electrode 542 through the second open region h6.

The first and second bonding portions 501 and 502 may be formed as a single layer or multiple layers by using at least one material of Ti, Al, In, Ir, Ta, Pd, Co, Cr, Mg, Zn, Ni, Si, Ge, Ag, Ag alloy, Au, Hf, Pt, Ru, Rh, ZnO, $IrO_x$, $RuO_x$, NiO, $RuO_x$/ITO, Ni/$IrO_x$/Au, Ni/$IrO_x$/Au/ITO, and the like or an alloy.

Figure 10:
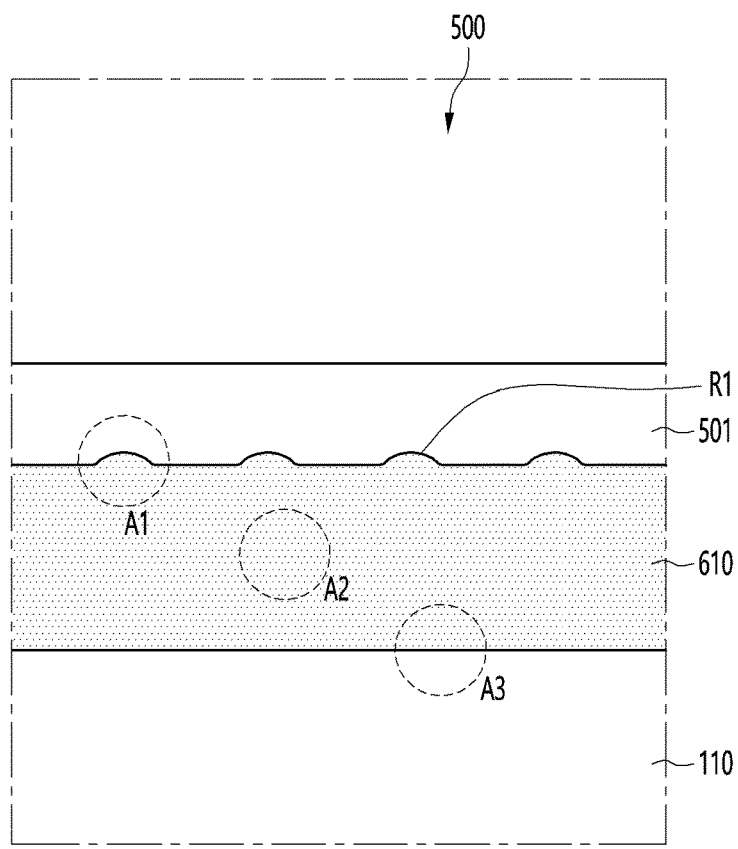
FIG. 10 is an enlarged view of region B of FIG. 4.

FIG. 10 is an enlarged view of region B of FIG. 4. Referring to FIG. 10, the first bonding portion 501 may include at least one concave portion. For example, the lower surface of the first bonding portion 501 may include at least one first concave portion R1 concave toward an upper surface of the first bonding portion 501. In detail, the light emitting structure 510 may include the first recess h1 described above, and the protective layer 550 may include the first open region h5. In addition, as the first bonding portion 501 is disposed to fill the first open region h5 of the protective layer 550, the lower surface of the first bonding portion 501 may have at least one first concave portion R1. The first concave portion R1 may be positioned in a region overlapping the first open region h5 in the vertical direction. A number of the first concave portions R1 may be greater than or equal to a number of the first open regions h5.

The first conductive portion 610 may be disposed on the first bonding portion 501. The first conductive portion 610 may be disposed in direct contact with the lower surface of the first bonding portion 501. The first conductive portion 610 may be disposed in the first concave portion R1. The first conductive portion 610 may be disposed in direct contact with an inner surface of the first concave portion R1. The first conductive portion 610 may be disposed to fill the entire first concave portion R1. The first frame 110 may be disposed on the lower surface of the first conductive portion 610. The lower surface of the first conductive portion 610 may be in direct contact with the upper surface of the first frame 110.

The first conductive portion 610 may include at least one of Ag, Au, Sn, Cu, AgSn, AuSn, and an alloy of the described-above materials. Preferably, the first conductive portion 610 may include AgSn. When the first conductive portion 610 includes AgSn, the first conductive portion 610 may include AgSn having a Sn ratio of about 2% to about 4%. In detail, the first conductive portion 610 may include AgSn having a Sn ratio of about 3% to 4%. In more detail, the first conductive portion 610 may include AgSn having a Sn ratio of about 3.5%.

The first conductive portion 610 may include a plurality of regions. For example, the first conductive portion 610 may include first to third regions A1, A2, and A3. The first region A1 may be a region that is in contact with the first bonding portion 501 in the first conductive portion 610. The third region A3 may be a region that is in contact with the first frame 110 in first conductive portion 610. The second region A2 may be a region between the first region A1 and the third region A3. The second region A2 may refer to a region corresponding to a point of about ½ a thickness of first conductive portion 610. That is, the second region A2 may be a region positioned between the first region A1 and the third region A3 based on the vertical direction.

The first region A1 of the first conductive portion 610 may include a first intermetallic compound formed by compounding with a material included in the first conductive portion 610 and the first bonding portion 501. The first conductive portion 610 and the first bonding portion 501 may be bonded by the first intermetallic compound.

In addition, the third region A3 of the first conductive portion 610 may include a second intermetallic compound formed by compounding the first conductive portion 610 and a material included in the first frame 110. The first conductive portion 610 and the first frame 110 may be bonded by the second intermetallic compound.

Compositions of materials contained in the first to third regions A1, A2, and A3 may be different from each other. For example, a content of silver (Ag) and a content of tin (Sn) included in each of the first region A1, the second region A2, and the third region A3 may be different from each other.

The content (wt %) of silver (Ag) included in the first region A1 may be about 5 wt % or less. In detail, the content (wt %) of silver (Ag) included in the first region A1 may be about 3 wt % or less.

The content (wt %) of silver (Ag) included in the second region A2 may be greater than the content (wt %) of silver (Ag) included in the first region A1. For example, the content (wt %) of silver (Ag) contained in the second region A2 may be about 20 wt % or less. In detail, the content (wt %) of silver (Ag) contained in the second region A2 may be about 10 wt % or less.

The content (wt %) of silver (Ag) included in the third region A3 may be greater than the content (wt %) of silver (Ag) included in the second region A2. For example, the content (wt %) of silver (Ag) contained in the third region A3 may be about 50 wt % or less. In detail, the content (wt %) of silver (Ag) included in the third region A3 may be about 40 wt % or less.

The content of silver (Ag) in the first conductive portion 610 may have a minimum value in the first region A1, and may have a maximum value in the third region A3. In addition, the content of silver (Ag) in the first conductive portion 610 may gradually increase from the first region A1 to the third region A3. In detail, the first frame 110 may include silver (Ag), and silver (Ag) included in the first conductive portion 610 may be migrated to the first frame 110. Accordingly, the content of silver (Ag) contained in the first to third regions A1, A2, and A3 may have the above-described characteristics.

In addition, the content (wt %) of tin (Sn) included in the first region A1 may be about 15 wt % or less. In detail, the content (wt %) of tin (Sn) included in the first region A1 may be about 10 wt % or less.

The content (wt %) of tin (Sn) included in the second region A2 may be greater than the content (wt %) of tin (Sn) included in the first region A1. For example, the content (wt %) of tin (Sn) included in the second region A2 may be about 45 wt % or more. In detail, the content (wt %) of tin (Sn) included in the second region A2 may be about 50 wt % or more.

The content (wt %) of tin (Sn) included in the third region A3 may be smaller than the content (wt %) of tin (Sn) included in the second region A2. For example, the content (wt %) of tin (Sn) included in the third region A3 may be about 50 wt % or less. In detail, the content (wt %) of tin (Sn) included in the third region A3 may be about 45 wt % or less.

The content of tin (Sn) in the first conductive portion 610 may have a minimum value in the first region A1 and may have a maximum value in the second region A2. In addition, the content of tin (Sn) in the first conductive portion 610 may gradually decrease toward the first region A1 based on the second region A2, and may gradually decrease toward the third region A3 based on the second region A2.

In addition, although not shown in the drawing, the second conductive portion 620 may include a plurality of regions. In detail, the second conductive portion 620 may include the first to third regions A1, A2, and A3. The first region A1 may be a region that is in contact with the second bonding portion 502 in the second conductive portion 620. The third region A3 may be a region that is in contact with the second frame 120 in the second conductive portion 620. The second region A2 may be a region between the first region A1 and the third region A3. The second region A2 may refer to a region corresponding to a point of about ½ a thickness of the second conductive portion 620. That is, the second region A2 may be a region positioned between the first region A1 and the third region A3 based on the vertical direction.

The second conductive portion 620 may include at least one of Ag, Au, Sn, Cu, AgSn, AuSn, and an alloy of the described-above materials. Preferably, the second conductive portion 620 may include AgSn. When the second conductive portion 620 includes AgSn, the second conductive portion 620 may include AgSn having a Sn ratio of about 2% to about 4%. In detail, the first conductive portion 610 may include AgSn having a Sn ratio of about 3% to 4%. In more detail, the first conductive portion 610 may include AgSn having a Sn ratio of about 3.5%.

Compositions of materials contained in the first to third regions A1, A2, and A3 of the second conductive portion 620 may be different from each other. For example, a content of silver (Ag) and/or a content of tin (Sn) included in each of the first region A1, the second region A2, and the third region A3 may be different from each other.

The content (wt %) of silver (Ag) included in the first region A1 may be about 5 wt % or less. In detail, the content (wt %) of silver (Ag) included in the first region A1 may be about 3 wt % or less.

The content (wt %) of silver (Ag) included in the second region A2 may be greater than the content (wt %) of silver (Ag) included in the first region A1. For example, the content (wt %) of silver (Ag) included in the second region A2 may be about 20 wt % or less. In detail, the content (wt %) of silver (Ag) included in the second region A2 may be about 10 wt % or less.

The content (wt %) of silver (Ag) included in the third region A3 may be greater than the content (wt %) of silver (Ag) included in the second region A2. For example, the content (wt %) of silver (Ag) included in the third region A3 may be about 50 wt % or less. In detail, the content (wt %) of silver (Ag) included in the third region A3 may be about 40 wt % or less.

The content of the silver (Ag) in the second conductive portion 620 may have a minimum value in the first region A1, and may have a maximum value in the third region A3. In addition, the content of silver (Ag) in the second conductive portion 620 may gradually increase from the first region (A1) toward the third region (A3). In detail, the second frame 120 may include silver (Ag), and the silver (Ag) included in the second conductive portion 620 may be migrated to the second frame 120. Accordingly, the content of silver (Ag) included in the first to third regions A1, A2, and A3 may have the above characteristics.

In addition, the content (wt %) of tin (Sn) included in the first region A1 may be about 15 wt % or less. In detail, the content (wt %) of tin (Sn) included in the first region A1 may be about 10 wt % or less.

The content (wt %) of tin (Sn) included in the second region A2 may be greater than the content (wt %) of tin (Sn) included in the first region A1. For example, the content (wt %) of tin (Sn) included in the second region A2 may be about 45 wt % or more. In detail, the content (wt %) of tin (Sn) included in the second region A2 may be about 50 wt % or more.

The content (wt %) of tin (Sn) included in the third region A3 may be smaller than the content (wt %) of tin (Sn) included in the second region A2. For example, the content (wt %) of tin (Sn) included in the third region A3 may be about 50 wt % or less. In detail, the content (wt %) of tin (Sn) included in the third region A3 may be about 45 wt % or less.

The content of tin (Sn) in the second conductive portion 620 may have a minimum value in the first region A1 and may have a maximum value in the second region A2. In addition, the content of tin (Sn) in the second conductive portion 620 may gradually decrease toward the first region A1 based on the second region A2, and may gradually decrease toward the third region A3 based on the second region A2.

Figure 11:
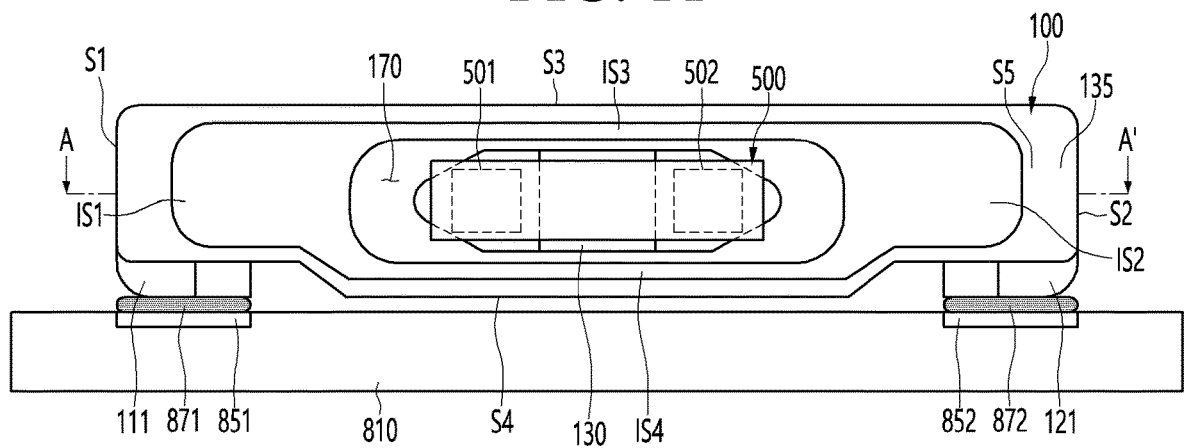
FIG. 11 is a view showing an example of a module in which a light emitting device package according to an embodiment is disposed on a circuit board.

FIG. 11 is a view illustrating an example of a module in which a light emitting device package according to an embodiment is disposed on a circuit board.

Referring to FIG. 11, a light emitting device package 1000 according to the embodiment may be a side view type light emitting device package. In the light source module, one or a plurality of light emitting device packages 1000 may be disposed on the circuit board 810 in a side view type.

The circuit board 810 may include a substrate member including first and second pads 851 and 852. A power supply circuit for controlling driving of the light emitting device 500 may be provided on the circuit board 810.

The light emitting device package 1000 may be disposed on the circuit board 810. For example, the light emitting device package 1000 may be disposed such that the fourth side surface S4 of the body 100 faces an upper surface of the circuit board 810.

The circuit board 810 may be a printed circuit board (PCB). The circuit board 810 may include at least one of a resin material PCB, a metal core PCB (MCPCB), a flexible PCB (FPCB), and a rigid PCB. In the circuit board 810, an insulating layer or a protective layer is disposed on a base layer made of a resin or metal material, and pads 851 and 852 exposed from the insulating layer or the protective layer are disposed. The pads 851 and 852 may electrically connect one or the plurality of light emitting device packages 1000. The insulating layer or the protective layer may be made of a solder resist material or a resin material.

The pads 851 and 852 may include at least one material selected from the group consisting of Ti, Cu, Ni, Au, Cr, Ta, Pt, Sn, Ag, P, Fe, Sn, Zn, and Al, or an alloy thereof.

The pads 851 and 852 may include a first pad 851 and a second pad 852 spaced apart from each other. The first pad 851 may be disposed in a region corresponding to the first lead portion 111 of the first frame 110. For example, the first pad 851 may be disposed in a region overlapping the first lead portion 111 in the vertical direction. In addition, the second pad 852 may be disposed in a region corresponding to the second lead portion 121 of the second frame 120. For example, the second pad 852 may be disposed in a region overlapping the second lead portion 121 in the vertical direction.

The first pad 851 may be electrically connected to the first frame 110 through the first lead portion 111, and the second pad 852 may be electrically connected to the second frame 120 through the second lead portion 121.

A first conductive portion 871 may be disposed between the first pad 851 and the first lead portion 111. The first conductive portion 871 may be in direct contact with an upper surface of the first pad 851 and a lower surface of the first lead portion 111, and may electrically connect the first pad 851 and the first lead portion 111 to each other. The first conductive portion 871 may be in direct contact with a side surface of the first lead portion. A second conductive portion 872 may be disposed between the second pad 852 and the second lead portion 121. The second conductive portion 872 may be spaced apart from the first conductive portion 871. The second conductive portion 872 may be in direct contact with an upper surface of the second pad 852 and a lower surface of the second lead portion 121, and may electrically connect the second pad 852 and the second lead portion 121 to each other. The second conductive portion 872 may be in direct contact with a side surface of the second lead portion.

The first bonding portion 501 of the light emitting device 500 may be connected to the first pad 851 by the first conductive portion 871, the first lead portion 111, the first frame 110, and the first conductive portion 610. In addition, the second bonding portion 502 may be connected to the second pad 852 by the second conductive portion 872, the second lead portion 121, the second frame 120, and the second conductive portion 620.

The first and second conductive portions 871 and 872 are made of a liquid material, and after positioning on the upper surface of each of the first and second pads 851 and 852 of the circuit board 810, the light emitting device package 1000 arranged on the circuit board 810 are coupled. The first and second conductive portions 871 and 872 may contain one material selected from the group consisting of Ag, Au, Pt, Sn, Cu, and the like, or an alloy thereof. The conductive portions 871 and 872 may include a solder paste, an Ag paste, and a Sn—Ag—Cu (SAC) paste. The conductive portions 871 and 872 may be compounded with a material contained in the pads 851 and 852 and the lead portions 111 and 121 of each of the frames 110 and 120 to be coupled by an intermetallic compound layer. For example, the intermetallic compound may include at least one of $Cu_xSn_y$, $Ag_xSn_y$, and $Au_xSn_y$, and the x may satisfy a condition of 0<x<1, y=1−x, x>y.

That is, in the embodiment, the conductive portions 610 and 620 may be formed on the bonding portions 501 and 502 of the light emitting device 500, and it is possible to prevent voids from being formed between the frames 110 and 120 and the conductive portions 610 and 620. Accordingly, it is possible to prevent cracks due to thermal shock or the like from occurring between the frames 110 and 120 and the conductive portions 610 and 620.

In addition, in the embodiment, the conductive portions 610 and 620 are formed on the bonding portions 501 and 502 of the light emitting device 500 in advance, so that the light emitting device 500 may be easily connected on the frames 110 and 120. In detail, as the size of the light emitting device is gradually reduced, there is a difficulty in soldering between the small light emitting device 500 and the frames 110 and 120. However, in the embodiment, as the conductive portions 610 and 620 are formed in advance, it is possible to prevent soldering defects such as alignment problems, formation of voids, and cracks between the light emitting device 500 and the frames 110 and 120.

In addition, the conductive portions 610 and 620 may surround the side and lower surfaces of the bonding portions 501 and 502 to effectively discharge heat emitted from the light emitting device 500. Accordingly, the embodiment may improve heat dissipation characteristics of the light emitting device package.

In addition, in the embodiment, it is possible to prevent a phenomenon that the bonding region between the light emitting device 500 and the body 130, for example, the conductive portions 610 and 620 are re-melted while the light emitting device package 1000 is bonded to the circuit board 810 or the like by forming the conductive portions 610 and 620 on the bonding portions 501 and 502 of the light emitting device 500.

The characteristics, structures and effects described in the embodiments above are included in at least one embodiment, but are not limited to one embodiment. Furthermore, the characteristic, structure, and effect illustrated in each embodiment may be combined or modified for other embodiments by a person skilled in the art. Thus, it should be construed that contents related to such a combination and such a modification are included in the scope of the embodiment.

In addition, the above description has been focused on the embodiment, but it is merely illustrative and does not limit the embodiment. A person skilled in the art to which the embodiment pertains may appreciate that various modifications and applications not illustrated above are possible without departing from the essential features of the embodiment. For example, each component particularly represented in the embodiment may be modified and implemented. In addition, it should be construed that differences related to such changes and applications are included in the scope of the present invention defined in the appended claims.

The invention claimed is:

1. A light emitting device package comprising:
a substrate;
a light emitting structure including a first conductive type semiconductor layer disposed on the substrate, an active layer disposed on the first conductive type semiconductor layer, and a second conductive type semiconductor layer disposed on the active layer;
a first electrode disposed on the light emitting structure and electrically connected to the first conductive type semiconductor layer;
a second electrode disposed on the light emitting structure and electrically connected to the second conductive type semiconductor layer;

a protective layer disposed on the first and second electrodes and insulating between the first and second electrodes;

a first and second frames disposed to be spaced apart from each other;

a body disposed surrounding the first and second frames and having first and second openings spaced apart from each other;

a light emitting device disposed on the body and including first and second bonding portions; and first and second conductive portions disposed in the first and second openings, respectively, wherein the first and second openings vertically overlap the first and second frames, respectively, the first and second conductive portions are electrically connected to the first and second frames, respectively, the first and second bonding portions are disposed in the first and second openings, respectively, and are electrically connected to the first and second conductive portions, the light emitting device includes a support region disposed on the body outside the first and second openings, the first bonding portion is disposed on the first electrode and electrically connected to the first electrode, and the second bonding portion is disposed on the second electrode and electrically connected to the second electrode, the protective layer includes one or a plurality of first open regions exposing a part of an upper surface of the first electrode and one or a plurality of second open regions exposing a part of an upper surface of the second electrode, the first bonding portion is electrically connected to a part of the upper surface of the first electrode exposed through the first open region, and the second bonding portion is electrically connected to a part of the upper surface of the second electrode exposed through the second open region.

2. The light emitting device package of claim 1, wherein the first conductive portion is disposed on a bottom surface and a side surface of the first bonding portion, and the second conductive portion is disposed on a bottom surface and a side surface of the second bonding portion.

3. The light emitting device package of claim 2, wherein the first conductive portion has a first thickness in a vertical direction between the first bonding portion and the first frame, and has a first width in a horizontal direction between the first bonding portion and an inner surface of the first opening.

4. The light emitting device package of claim 3, wherein the first thickness of the first conductive portion is 5 μm to 30 μm, the first width of the first conductive portion is 5 μm to 30 μm, and the first thickness and first width of the first conductive portion correspond to each other.

5. The light emitting device package of claim 3, wherein, a width in the horizontal direction of the first opening is larger than a width in the horizontal direction of the first bonding portion, and a width in the horizontal direction of the second opening is larger than a width in the horizontal direction of the second bonding portion.

6. The light emitting device package of claim 1, wherein an area of a bottom surface of each of the first and second conductive portions is larger than an area of a bottom surface of each of the first and second bonding portions.

7. The light emitting device package of claim 1, wherein a width in the horizontal direction of the first bonding portion is larger than a width in the horizontal direction of the first conductive portion, and a width in the horizontal direction of the second bonding portion is larger than a width in the horizontal direction of the second conductive portion.

8. The light emitting device package of claim 1, wherein the first and second conductive portions include AgSn.

9. The light emitting device package of claim 8, wherein the first conductive portion includes:

a first region in contact with a lower surface of the first bonding portion;

a third region in contact with an upper surface of the first frame; and a second region disposed between the first and third regions, and contents of silver (Ag) contained in the first to third regions are different from each other.

10. The light emitting device package of claim 9, wherein a content of silver (Ag) contained in the first conductive portion increases from the first bonding portion toward the first frame.

11. The light emitting device package of claim 1, further comprising a first resin disposed between the body and the light emitting device, wherein the first resin is in contact with a lower surface of the light emitting device.

12. The light emitting device package of claim 1, further comprising a second resin disposed on the body, wherein the second resin is disposed outside the first and second openings and is in contact with a side surface of the light emitting device.

13. The light emitting device package of claim 1, further comprising a cavity in which the light emitting device is disposed, wherein the first and second frames are disposed on a bottom surface of the cavity, and a thickness in a vertical direction of the light emitting device is 35% to 65% of a height in a vertical direction of the cavity.

14. The light emitting device package of claim 1, wherein the lower surfaces of the first and second bonding portions are positioned below the upper surface of the body, and are positioned above lower surfaces of the first and second openings.

15. The light emitting device package of claim 1, wherein the first frame includes a first lead portion extending toward a first side surface of the body and bent from one end toward a fourth side surface of the body to protrude from the fourth side surface, and a first heat radiating portion bent from the first lead portion to be disposed on a rear surface of the first side surface, and the second frame includes a second lead portion extending toward a second side surface of the body and bent from one end toward a fourth side surface of the body to protrude from the fourth side surface, and a second heat radiating portion bent from the second lead portion to be disposed on a rear surface of the second side surface.

16. The light emitting device package of claim 7, wherein a first gap is formed between the first bonding portion and the first frame, and a second gap is formed between the second bonding portion and the second frame.

17. The light-emitting device package of claim 1, wherein the lower surface of the first bonding portion includes at least one first concave portion concave toward an upper surface of the first bonding portion, and the lower surface of the second bonding portion includes at least one second concave portion concave toward the upper surface of the second bonding portion.

18. The light-emitting device package of claim 17, wherein the first concave portion is disposed in a region corresponding to the first open region in a vertical direction, and the second concave portion is disposed in a region corresponding to the second open region in the vertical direction.

19. A light source module comprising:

a circuit board; and at least one light emitting device package disposed on the circuit board, wherein the light emitting device package includes any one of the light emitting device packages of claim 1.

* * * * *